United States Patent
Tinnemans et al.

(10) Patent No.: US 9,939,742 B2
(45) Date of Patent: Apr. 10, 2018

(54) METHOD AND APPARATUS FOR MEASURING ASYMMETRY OF A MICROSTRUCTURE, POSITION MEASURING METHOD, POSITION MEASURING APPARATUS, LITHOGRAPHIC APPARATUS AND DEVICE MANUFACTURING METHOD

(71) Applicant: ASML Netherlands B.V., Veldhoven (NL)

(72) Inventors: Patricius Aloysius Jacobus Tinnemans, Hapert (NL); Arie Jeffrey Den Boef, Waalre (NL); Simon Gijsbert Josephus Mathijssen, Den Bosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 31 days.

(21) Appl. No.: 14/427,942

(22) PCT Filed: Nov. 4, 2013

(86) PCT No.: PCT/EP2013/072949
§ 371 (c)(1),
(2) Date: Mar. 12, 2015

(87) PCT Pub. No.: WO2014/068116
PCT Pub. Date: May 8, 2014

(65) Prior Publication Data
US 2015/0227061 A1    Aug. 13, 2015

Related U.S. Application Data

(60) Provisional application No. 61/722,671, filed on Nov. 5, 2012.

(51) Int. Cl.
*G03B 27/68* (2006.01)
*G03F 9/00* (2006.01)

(52) U.S. Cl.
CPC .......... *G03F 9/7069* (2013.01); *G03F 9/7088* (2013.01)

(58) Field of Classification Search
CPC ........................... G03F 9/7069; G03F 9/7088
See application file for complete search history.

(56) References Cited

U.S. PATENT DOCUMENTS 6,961,116 B2    11/2005  Den Boef et al.
7,297,971 B2    11/2007  Van Bilsen et al.
(Continued)

FOREIGN PATENT DOCUMENTS

JP    2002-372406    12/2002
JP    2004-117030    4/2004
(Continued)

OTHER PUBLICATIONS

Japanese Office Action dated Jan. 13, 2016 in corresponding Japanese Patent Application No. 2015-540149.
(Continued)

*Primary Examiner* — Deoram Persaud
(74) *Attorney, Agent, or Firm* — Pillsbury Winthrop Shaw Pittman LLP

(57) ABSTRACT

A lithographic apparatus includes a sensor, such as an alignment sensor including a self-referencing interferometer, configured to determine the position of an alignment target including a periodic structure. An illumination optical system focuses radiation of different colors and polarizations into a spot which scans the structure. Multiple position-dependent signals are detected and processed to obtain multiple candidate position measurements. Asymmetry of the structure is calculated by comparing the multiple posi-
(Continued)

tion-dependent signals. The asymmetry measurement is used to improve accuracy of the position read by the sensor. Additional information on asymmetry may be obtained by an asymmetry sensor receiving a share of positive and negative orders of radiation diffracted by the periodic structure to produce a measurement of asymmetry in the periodic structure.

27 Claims, 11 Drawing Sheets

(56) References Cited

U.S. PATENT DOCUMENTS

| | | | |
|---|---|---|---|
| 7,319,506 | B2 | 1/2008 | Den Boef et al. |
| 7,610,898 | B2 | 11/2009 | Hiraku et al. |
| 8,072,615 | B2 | 12/2011 | Musa et al. |
| 8,208,121 | B2 | 6/2012 | Bijnen et al. |
| 8,243,259 | B2 | 8/2012 | Prosyentsov et al. |
| 8,593,646 | B2 | 11/2013 | Den Boef et al. |
| 8,867,020 | B2 | 10/2014 | Smilde et al. |
| 9,046,385 | B2 | 6/2015 | Bijnen et al. |
| 9,140,998 | B2 | 9/2015 | Smilde et al. |
| 2002/0062204 | A1 | 5/2002 | Nakajima |
| 2003/0143761 | A1* | 7/2003 | Fukuda ............... H01L 23/544 438/7 |
| 2004/0033426 | A1 | 2/2004 | Den Boef et al. |
| 2004/0059540 | A1 | 3/2004 | Matsumoto et al. |
| 2006/0007446 | A1 | 1/2006 | Den Boef et al. |
| 2006/0081792 | A1 | 4/2006 | Van Bilsen et al. |
| 2009/0153825 | A1 | 6/2009 | Edart et al. |
| 2009/0153861 | A1 | 6/2009 | Musa et al. |
| 2009/0195768 | A1 | 8/2009 | Bijnen et al. |
| 2009/0316122 | A1 | 12/2009 | Prosyentsov et al. |
| 2010/0245792 | A1 | 9/2010 | Bijnen et al. |
| 2010/0321654 | A1* | 12/2010 | Den Boef ........... G03F 7/70633 355/53 |
| 2012/0044470 | A1 | 2/2012 | Smilde et al. |
| 2012/0057171 | A1 | 3/2012 | Khuat Duy |
| 2012/0062863 | A1 | 3/2012 | Bijnen et al. |
| 2012/0123581 | A1 | 5/2012 | Smilde et al. |
| 2012/0212718 | A1 | 8/2012 | Den Boef et al. |
| 2012/0212749 | A1 | 8/2012 | Den Boef et al. |
| 2012/0242970 | A1 | 9/2012 | Smilde et al. |
| 2015/0176979 | A1* | 6/2015 | Mathijssen ......... G03F 7/70633 355/77 |
| 2015/0234290 | A1* | 8/2015 | Mathijssen ......... G03F 7/70141 355/67 |
| 2015/0355554 | A1* | 12/2015 | Mathijssen ........... G03F 9/7046 355/67 |

FOREIGN PATENT DOCUMENTS

| | | |
|---|---|---|
| JP | 2009-147317 | 7/2009 |
| JP | 2009-147328 | 7/2009 |
| JP | 2010-004040 | 1/2010 |
| JP | 2010-232656 | 10/2010 |
| JP | 2012-060120 | 3/2012 |
| JP | 2012-060131 | 3/2012 |
| TW | 201226891 | 7/2012 |
| TW | 201229496 | 7/2012 |
| TW | 201232060 | 8/2012 |
| WO | 2013/152878 | 10/2013 |
| WO | 2014/026819 | 2/2014 |

OTHER PUBLICATIONS

International Search Report dated Mar. 20, 2014 in corresponding International Patent Application No. PCT/EP2013/072949.
Jeroen Huijbregtse et al., "Overlay Performance with Advanced ATHENA™ Alignment Strategies," Proc. of SPIE, vol. 5038, pp. 918-928 (2003).
Joep Roijers, "On-product SMASHed!" ASML Images Magazine, pp. 20-23 (Spring 2009).
"Hodges-Lehmann Estimator," Wikipedia, pp. 1-3, Downloaded Aug. 21, 2012.
Taiwan Office Action dated Aug. 19, 2015 in corresponding Taiwan Patent Application No. 102140163.

* cited by examiner

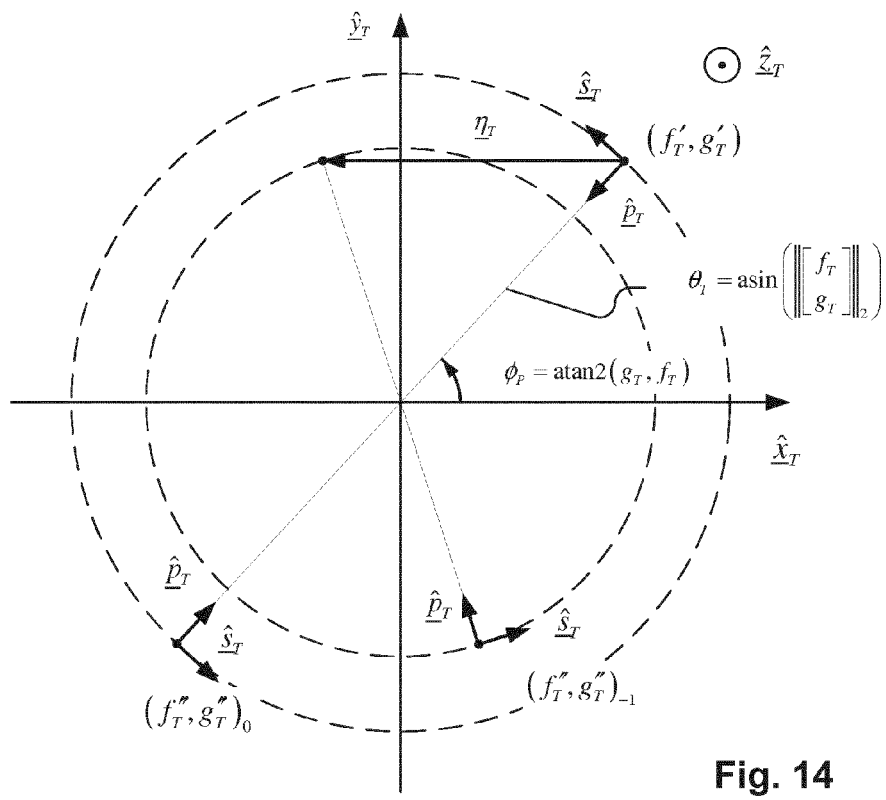
Fig. 14
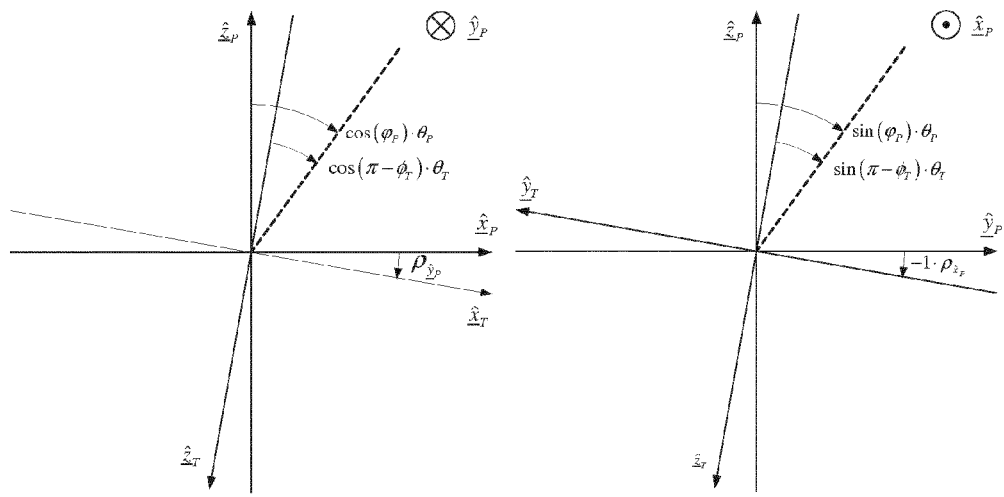
Fig. 15          Fig. 16

METHOD AND APPARATUS FOR MEASURING ASYMMETRY OF A MICROSTRUCTURE, POSITION MEASURING METHOD, POSITION MEASURING APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2013/072949, which was filed on Nov. 4, 2013, which claims the benefit of priority of U.S. provisional patent application No. 61/722,671, which was filed on Nov. 5, 2012, and which is incorporated herein in its entirety by reference.

FIELD

The present invention relates to an improved apparatus and method to measure a property or position of a structure. The invention in other aspects provides a lithographic apparatus and device manufacturing method, and also an optical element.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, one or more alignment marks are generally provided on, for example, the substrate, and the lithographic apparatus includes one or more alignment sensors by which the position of the mark may be measured accurately. The alignment sensor may be effectively a position measuring apparatus. Different types of marks and different types of alignment sensors are known from different times and different manufacturers. A type of sensor known for a lithographic apparatus is based on a self-referencing interferometer as described in U.S. Pat. No. 6,961,116, the contents of which is incorporated herein in its entirety by reference. Generally a mark is measured separately to obtain X- and Y-positions. A combined X- and Y-measurement can be performed using one or more the techniques described in U.S. patent application publication no. US US 2009/0195768, the contents of which is incorporated herein in its entirety by reference.

SUMMARY

Advanced alignment techniques using an alignment sensor are described by Jeroen Huijbregtse et al. in "Overlay Performance with Advanced ATHENA™ Alignment Strategies", Metrology, Inspection, and Process Control for Microlithography XVII, Daniel J. Herr, Editor, Proceedings of SPIE Vol. 5038 (2003). These strategies can be extended and applied in sensors of the type described by U.S. Pat. No. 6,961,116 and US 2009/0195768, mentioned above. A feature of a sensor is that it may measure position using several wavelengths (e.g., colors) and polarizations of radiation (e.g., light) on the same target grating or gratings. No single color is ideal for measuring in all situations, so the system selects from a number of signals, which one provides the most reliable position information.

There is continually a need to provide more accurate position measurement, especially to control the overlay error as product features get smaller and smaller. A cause of error in alignment may be asymmetry in the features making up a mark, which may be caused for example by processing to apply one or more subsequent product layers. A metrology tool such as a scatterometer exist that can measure asymmetry and one or more other parameters of a microstructure. Such a tool could be applied in principle to measure and correct for asymmetry or the other parameter. In practice, however, such a tool may not operate with high throughput desired in the alignment task for high-volume lithographic production. Such a tool may additionally or alternatively be incompatible with the alignment environment in terms of its bulk, mass or power dissipation.

In a broad aspect, the invention aims to provide an alternative method and apparatus for the measurement of asymmetry (or more generally, one or more asymmetry dependent parameters) in a microstructure.

In a further aspect, the invention aims to provide an improved position measurement apparatus, for example an alignment sensor in a lithographic apparatus, that is able to correct for the influence of mark asymmetry on position measurement. In that regard, there is provided, in an embodiment, a method of measuring asymmetry that can be applied to measuring asymmetry in an alignment mark simultaneously with position measurement from that mark, without unduly reducing throughput of an alignment system. Further, in an embodiment, there is provided a method that employs signals already captured as part of the position measuring task.

According to an aspect, there is provided a method of measuring a property of a structure on, for example, a substrate, for example an asymmetry-related parameter, the method comprising:

(a) illuminating the structure with radiation and detecting radiation diffracted by the structure using one or more detectors;

(b) processing signals representing the diffracted radiation to obtain a plurality of results related to a position of the structure, each result having the same form but being influenced in a different way by variation in the property;

(c) calculating a measurement of the property of the structure that is at least partially based on a difference or differences observed among the plurality of results.

In an embodiment, the plurality of results includes results based on illumination and detection of radiation at different wavelengths, different polarizations and/or different spatial frequencies within a position-dependent signal received by one detector. The differences between results used in the calculating step (c) do not have to be expressed in a particular form such as simple subtraction. Differences between results can be expressed in any suitable form.

In an embodiment, the measurement calculated in step (c) includes one or more further results, for example one or more other results obtained using radiation diffracted by the structure, but not related to the position of the structure. The other result may be obtained for example using another detector processing a different portion of the radiation diffracted by the structure at the same time as the detection in step (b). The other result may alternatively or in addition include a result obtained from the same signals as the results related to the position of the structure.

According to an aspect, there is provided a method of measuring the position of a periodic structure on, for example, a substrate, the method comprising measuring a property of the structure using a method described above, and further comprising: (d) calculating a measurement of the position of the structure using one or more of the results obtained in step (b) and corrected in accordance with the measurement of the property obtained in step (c).

According to an aspect, there is provided a method of manufacturing devices wherein a device pattern is applied to a substrate using a lithographic process, the method including positioning the applied pattern by reference to a measured position of one or more periodic structures formed on the substrate, the measured position being obtained by a method as described herein.

According to an aspect, there is provided a lithographic apparatus comprising:
a patterning subsystem for transferring a pattern to a substrate;
a measuring subsystem for measuring positions of the substrate in relation to the patterning subsystem,
wherein the patterning subsystem is arranged to use the positions measured by the measuring subsystem to apply the pattern at a desired position on the substrate and wherein the measuring subsystem is arranged to measure the positions of the substrate using one or more periodic structures provided on the substrate and measuring the positions of the structure using a method as described herein.

According to an aspect, there is provided an apparatus for measuring the position of a structure on, for example, a substrate, the apparatus comprising:
an illuminating arrangement for illuminating the structure with radiation;
a detecting arrangement for detecting radiation diffracted by the structure using one or more detectors;
a processing arrangement for processing signals representing the diffracted radiation to obtain a plurality of results related to a position of the structure, each result having the same form but being influenced in a different way by variation in a property of the structure; and
a calculating arrangement for calculating a position of the structure using one or more of the results obtained by the processing arrangement,
wherein the calculating arrangement is arranged to include a correction in the calculated position in accordance with a measurement of the property of the structure, and wherein the calculating arrangement is arranged to calculate the measurement of the property of the structure at least partially on the basis of a difference observed among the plurality of results.

Embodiments of the invention enable measurements of a property, for example asymmetry, to be obtained or refined using information that is ordinarily captured by a sensor, but not ordinarily exploited. The plurality of results may, for example, include results based on different wavelengths, different polarizations, different spatial frequencies (diffraction orders), or one or more combinations of these. The method can be used in combination with more measurements of the property made by other means.

BRIEF DESCRIPTION OF THE DRAWINGS

Embodiments of the invention will now be described, by way of example only, with reference to the accompanying schematic drawings in which:

FIGS. 12 to 18 define coordinate systems and notation used in the mathematical description of the embodiment, including the influence of target tilt on polarization coordinate systems.

DETAILED DESCRIPTION OF EXEMPLARY EMBODIMENTS

Figure 1:
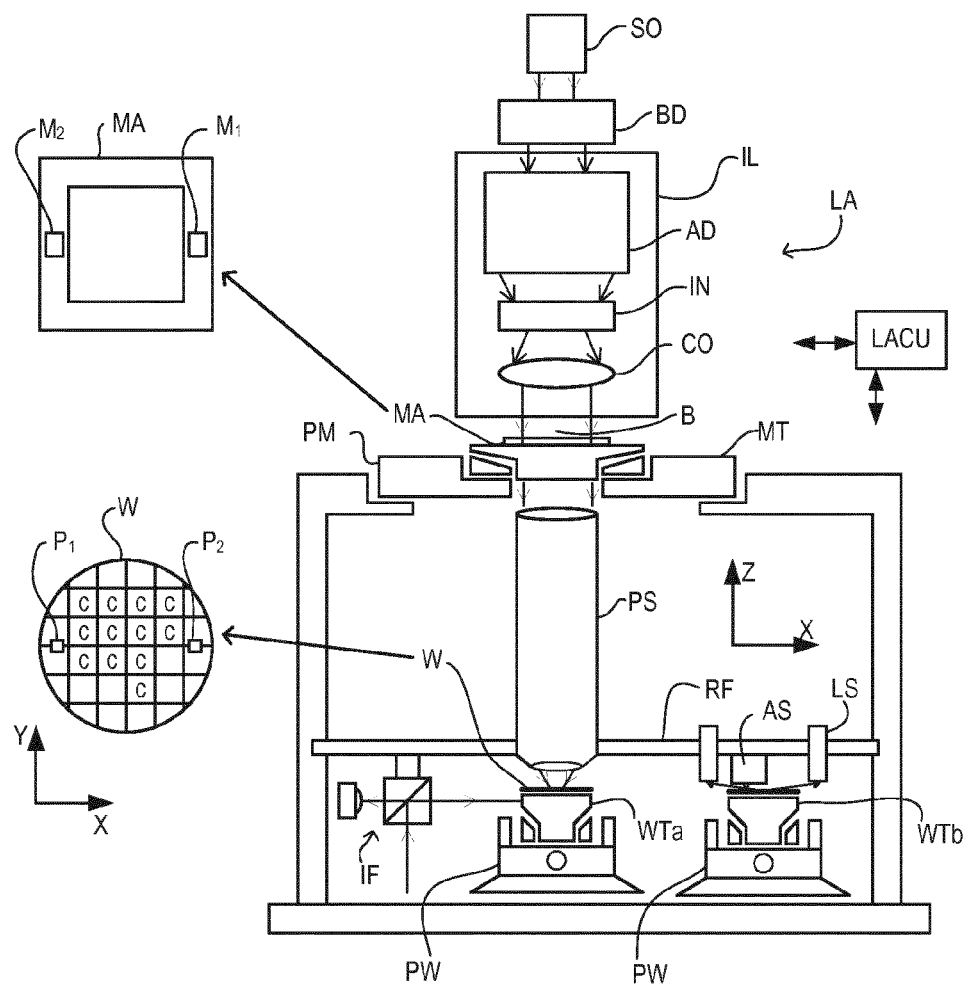
FIG. 1 depicts an exemplary lithographic apparatus including an alignment sensor as a measuring apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa and WTb and two stations—an exposure station and a measurement station—between which the tables can be exchanged. For example, while one substrate on one substrate table is being exposed at the exposure station, another substrate can be loaded onto the other substrate table at the measurement station so that various preparatory steps may be carried out. In an embodiment, one table is a substrate table and another table is a measurement table including one or more sensors. Preparatory steps may be performed at the measurement station such as mapping the surface of the substrate using a level sensor LS and/or measuring the position of one or more alignment markers on, for example, the substrate using an alignment sensor AS. Such preparatory steps enable a substantial increase in the throughput of the apparatus. If the position sensor IF is not capable of measuring the position of the table while it is at the measurement station as well as at the exposure station, a second position sensor may be provided to enable the positions of the table to be tracked at both stations.

The apparatus further includes a lithographic apparatus control unit LACU which controls the movements and measurements of the various actuators and sensors described. Control unit LACU also includes signal processing and data processing capacity to implement desired calculations relevant to the operation of the apparatus. In practice, control unit LACU may be realized as a system of many sub-units, each handling the real-time data acquisition, processing and control of a subsystem or component within the apparatus. For example, one processing subsystem may be dedicated to servo control of the positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

FIG. 2(a) shows examples of alignment marks 202, 204, provided on substrate W for the measurement of X-position and Y-position, respectively. Each mark in this example comprises a series of bars formed in a product layer or other layer applied to or etched into, for example, the substrate. The bars are regularly spaced and act as grating lines so that the mark can be regarded as a diffraction grating with a sufficiently well-known spatial period (pitch). The bars on the X-direction mark 202 are substantially parallel to the Y-axis to provide periodicity in the X-direction, while the bars of the Y-direction mark 204 are substantially parallel to the X-axis to provide periodicity in the Y-direction. Marks can be periodic in one direction only, or in more than one direction at the same time. The skilled reader will appreciate that a mark in practice may not be perfectly periodic, as imperfections such as line edge roughness are present in any real structure. The alignment sensor AS (shown in FIG. 1) scans each mark optically with a spot 206 (X direction), 208 (Y direction) of radiation, to obtain a periodically-varying signal, such as a sine wave. The phase of this signal is analyzed, to measure the position of the mark, and hence of, for example, substrate W, relative to the alignment sensor, which in turn is fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying a pattern to the substrate. Fine position information can be obtained because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches can also be used for this purpose. These techniques are known to the person skilled in the art, and will not be detailed herein. The design and operation of such a sensor is known in the art, and each lithographic apparatus may have its own design of sensor. For the purpose of the present description, it will be assumed that the alignment sensor AS is generally of the form described in U.S. Pat. No. 6,961,116. FIG. 2(b) shows a modified mark for use with a similar alignment system, in which X- and Y-positions can be obtained through a single optical scan with the illumination spot 206 or 208. The mark 210 has bars arranged at substantially 45 degrees to both the X- and Y-axes. This combined X- and Y-measurement can be performed using the techniques described in U.S. patent application publication no. US 2009/0195768.

Figure 2:
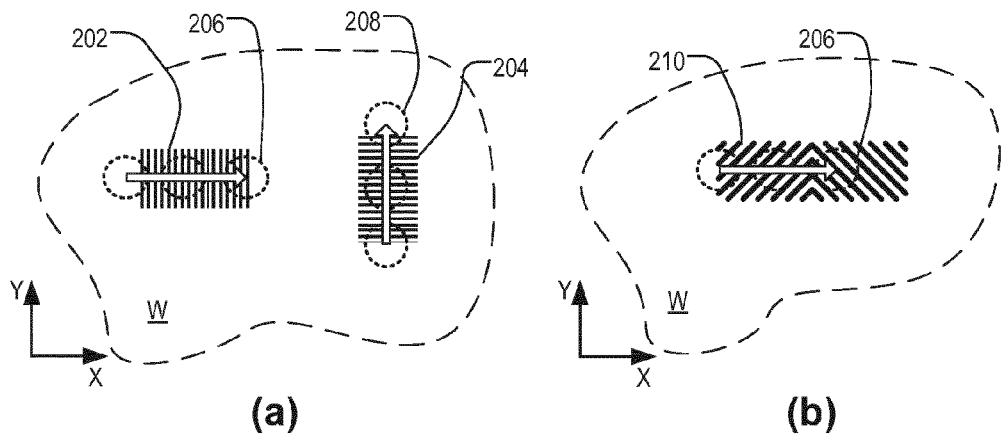
FIG. 2, comprising FIG. 2($a$) and FIG. 2($b$), illustrates various forms of an alignment mark that may be provided in or on, for example, a substrate in the apparatus of FIG. 1.
Figure 3:
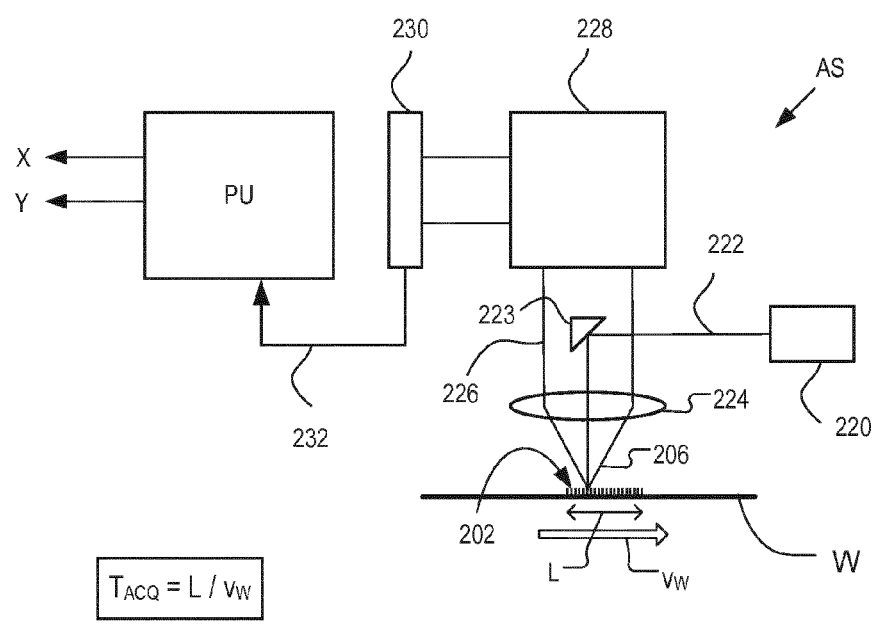
FIG. 3 is a schematic block diagram of an alignment sensor scanning an alignment mark in the apparatus of FIG. 1.

FIG. 3 is a schematic block diagram of an alignment sensor AS. Illumination source 220 provides a beam 222 of radiation of one or more wavelengths, which is diverted by a spot mirror 223 through an objective lens 224 onto a mark, such as mark 202, located on substrate W. As indicated schematically in FIG. 2, in the example of the present alignment sensor based on U.S. Pat. No. 6,961,116, mentioned above, the illumination spot 206 by which the mark 202 is illuminated may be slightly smaller in width (e.g., diameter) than the width of the mark itself.

Radiation scattered by mark 202 is picked up by objective lens 224 and collimated into an information-carrying beam 226. A self-referencing interferometer 228, such as of the type disclosed in U.S. Pat. No. 6,961,116 mentioned above, processes beam 226 and outputs separate beams (for each wavelength) onto a sensor array 230. Spot mirror 223 serves conveniently as a zero order stop at this point, so that the information carrying beam 226 comprises only higher order diffracted radiation from the mark 202 (this is not essential to the measurement, but improves signal to noise ratios). Intensity signals 232 from one or more individual sensors in sensor grid 230 are provided to a processing unit PU. By a combination of the optical processing in the block 228 and the computational processing in the unit PU, values for X- and Y-position of the substrate relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated fixes the position of the mark within a certain range corresponding to one pitch of the mark. Coarser measurement techniques are used in conjunction with this to identify which period of the sine wave is the one containing the marked position. The same process at coarser and/or finer levels can be repeated at different wavelengths for increased accuracy, and for robust detection of the mark irrespective of the materials from which the mark is made, and in, on and/or below which it sits. The wavelengths can be multiplexed and demultiplexed optically so as to be processed simultaneously, and/or they may be multiplexed by time division or frequency division. Examples in the present disclosure will exploit measurement at several wavelengths to provide a practical and robust measurement apparatus (alignment sensor) with reduced sensitivity to mark asymmetry.

Referring to the measurement process in more detail, an arrow labeled $v_W$ in FIG. 3 illustrates a scanning velocity with which spot 206 traverses the length L of mark 202. In this example, the alignment sensor AS and spot 206 in reality remain substantially stationary, while it is the mark 202 that moves with velocity $v_W$. The alignment sensor can thus be mounted rigidly and accurately to the reference frame RF (FIG. 1), while effectively scanning the mark 202 in a direction opposite to the direction of movement of mark 202. The mark 202 in this example is controlled in this movement by its location on substrate W which is mounted on the substrate table WT and the substrate positioning system PW. All movements shown are substantially parallel to the X axis. Similar actions apply for scanning the mark 204 with spot 208 in the Y direction. This will not be described further.

As discussed in U.S. patent application publication no. US 2012-0212749, incorporated by reference herein in its entirety, high productivity requirements of the lithographic apparatus means that measurement of the alignment marks at numerous positions on the substrate should be performed as quickly as possible, which implies that the scanning velocity $v_W$ is fast, and the time $T_{ACQ}$ available for acquisition of each mark position is correspondingly short. In simplistic terms, the formula $T_{ACQ}=L/v_W$ applies. US 2012-0212749 describes a technique to impart an opposite scanning motion of the spot, so as to lengthen the acquisition time. The same scanning spot technique can be applied in a sensor and method of the type newly disclosed herein, if desired.

There is interest in aligning on marks with smaller grating pitches. The measured overlay in real production can be generally significantly larger than under controlled test conditions. This may be due to the alignment marks on product substrates becoming asymmetric to varying degrees during processing. Reducing the pitch of the alignment marks decreases the effect of some types of asymmetry on the measured alignment position.

Some options to allow reduction of the pitch of an alignment grating include (i) shortening the wavelength of radiation used, (ii) increasing the numerical aperture (NA) of the alignment sensor optics and/or (iii) using off-axis illumination. A shorter wavelength is not always possible since alignment gratings are often located underneath an absorbing film (for example an amorphous carbon hard mask). Increasing the NA is in general possible but may not be preferred since there is a desire for a compact objective with a safe distance from the substrate. Therefore using off-axis illumination is attractive.

Position Measurement with Off-axis Illumination

Figure 4:
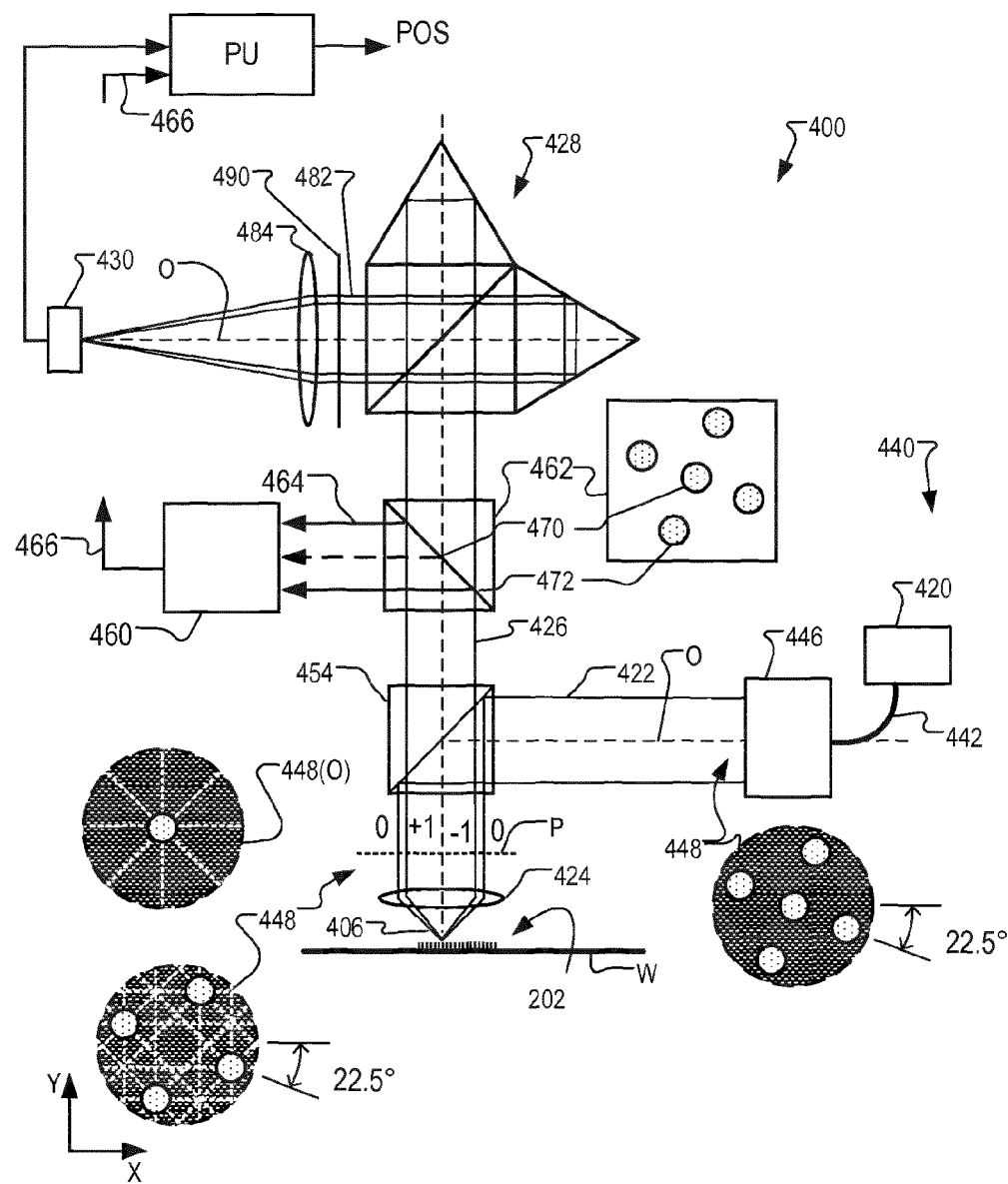
FIG. 4 is a more detailed schematic diagram of an alignment sensor suitable for use in an embodiment of the present invention and useable as the alignment sensor in the apparatus of FIG. 1, and including off-axis illumination and an optional asymmetry measuring arrangement.

FIG. 4 illustrates an optical system 400 of an alignment sensor that is a modified version of one described in U.S. Pat. No. 6,961,116 and US 2009/0195768 mentioned above. This introduces the option of off-axis illumination modes which, among other things, allow a reduced pitch of alignment mark for greater accuracy. The optical system may also allow scatterometry type measurements to be performed with the alignment sensor, rather than with a separate scatterometer instrument. In FIG. 4, for simplicity, the details of multiple wavelengths and polarizations are omitted. More detail of these aspects of the optical system will be described with reference to FIG. 9.

An optical axis O which has several branches is indicated by a broken line running throughout the optical system 400. For ease of comparison with the schematic diagram of FIG. 3, some parts of the optical system 400 are labeled with reference signs similar to those used in FIG. 3, but with prefix "4" instead of "2". Thus, there is a radiation source 420, an illumination beam 422, an objective lens 424, an information carrying beam 426, a self-referencing interferometer 428 and a detector 430. In practice, multiple detectors may be provided, which will described in a little more detail below, with reference to FIG. 9. Signals from the detector is processed by processing unit PU, which is modified so as to implement the features described below and to output an (improved) position measurement POS for each mark.

Additional components illustrated in this more detailed schematic diagram are as follows. In an illumination subsystem 440, radiation from source 420 is delivered via an optical fiber 442 to an illumination profiling optic 446. This delivers input beam 422 via beam splitter 454 to objective lens 424 having a pupil plane P. Objective lens 424 forms a spot 406 on alignment mark 202/204/210. Information-carrying beam 426, diffracted by the mark, passes through beam splitter 454 to interferometer 428. Interferometer 428 splits the radiation field into two parts with orthogonal polarization, rotates these parts about the optical axis by 180° relative to one another, and combines them into an outgoing beam 482. A lens 484 focuses the entire field onto a detector 430, which is an arrangement similar to the alignment sensor of FIG. 3. The detector 430 in this example and in the alignment sensor are effectively single photodiodes and do not provide any spatial information except by the scanning motion described already. A detector having spatial resolution in a conjugate pupil plane can be added, to allow an angle-resolved scatterometry method to be performed using the alignment sensor hardware.

Included in the present example is an asymmetry measuring arrangement 460. Arrangement 460 receives a part 464 of the information carrying beam 426 through a second beam splitter 462 positioned in advance of the interferometer 428. In the present disclosure, a novel technique for the measurement of asymmetry using position information obtained through the detector 430 is described. In principle, a dedicated asymmetry measuring arrangement 460 could be eliminated. However, in the particular embodiments described herein, the techniques are used to obtain additional information on asymmetry, that can be combined with the results of dedicated asymmetry measuring arrangement 460. This allows the apparatus user to improve further the accuracy of asymmetry information available, and thereby to enable a more accurate and/or more measurement of position.

Illumination profiling optic 446 can take various forms, some of which are disclosed in more detail in US patent application no. U.S. 61/623,391, filed Apr. 12, 2012, the contents of which is incorporated herein its entirety by reference. In the examples disclosed therein, an alignment sensor (more generally, a position measuring apparatus) is shown which may allow the use of a reduced grating pitch without the need for spatial resolution on the detector side. By use of one or more novel illumination modes, the apparatus may be able to measure the position of a mark with a wide range of different pitches, for example from less than 1 μm to about 20 microns, without changing the current detector design. A particular feature common to the examples described in U.S. 61/623,391 mentioned above, is the option to use off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the alignment mark from substantially λ/NA to substantially λ/2NA, where λ, is the wavelength of radiation used, and NA is the numerical aperture of an objective lens of the instrument (e.g. the alignment sensor or more generally the position measuring apparatus). The examples described in U.S. 61/623,391 also use a particular distribution of spot mirrors in a beam splitter of the apparatus, which can both provide the desired illumination and act as a field stop for zero order diffracted radiation. A 'universal' illumination profile can be designed that allows for aligning on any of the X, Y and XY marks without changing the illumination mode, although this inevitably brings some compromise in performance and/or some complication in the apparatus. Alternatively, dedicated modes can be designed and made to be selectable for use with the different mark types. Different polarizations of illumination can be selected also.

A primary function of the illumination profiling optic 446 is such to supply coherent radiation from first and second source regions within a pupil of the objective lens 424. The first and second regions are confined to a peripheral portion of the pupil (in the sense of at least being away from the optical axis). They are each limited in angular extent and are positioned essentially diametrically opposite one another with respect to the optical axis. As will be seen from the examples in U.S. 61/623,391, the source regions may take the form of very small spots, or may be more extended in form. Further source regions may be provided, in particular third and fourth source regions may be provided rotated at about 90° from the first and second regions. A particular embodiment of illumination profiling optics 446 comprises a self-referencing interferometer of the same general form as interferometer 428. The apparatus as a whole need not be limited to providing these particular off-axis illumination profiles. It may have other modes of use, both known or yet to be developed, which favor the use of different profiles. A particular alternative profile, included in discussions below, is one having a single, on-axis region.

It should be noted that in the example shown in FIG. 4 some polarizing elements used in practice around the interferometer have been omitted. This is only done to simplify the explanation of this idea. In a real implementation they may need to be included. Additionally, measurements may be with different polarizations according to the mark type, and/or to make measurements with more than one polarization on each mark. The features to achieve desired polarizations can readily be envisaged by the skilled person. Some more detail will be given below with reference to FIG. 9.

Figure 5:
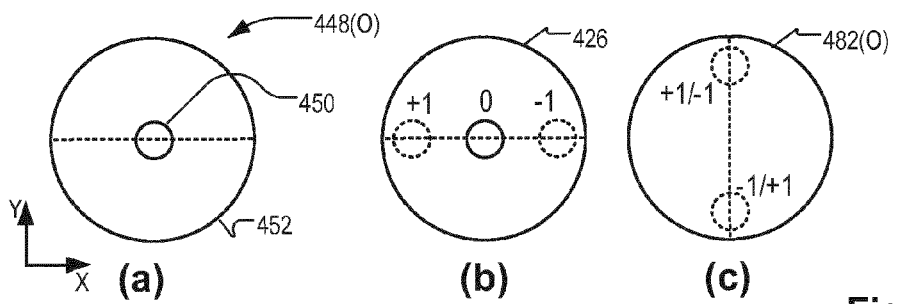
FIG. 5 illustrates (a) an on-axis illumination profile, (b) resulting diffraction signals, and (c) resulting self-referencing interferometer output for a single wavelength of radiation in one use of the position measuring apparatus of FIG. 4.
Figure 6:
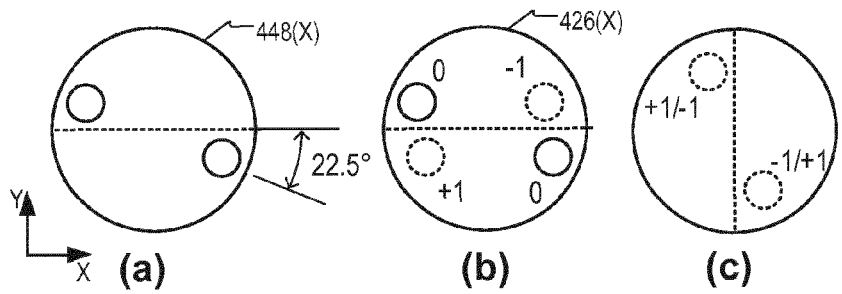
FIG. 6 illustrates (a) an off-axis illumination profile, (b) resulting diffraction signals, and (c) resulting self-referencing interferometer output in one use of the position measuring apparatus of FIG. 4.

Referring to FIGS. 5 and 6, selection of on- and off-axis illumination modes for the different mark types shown in FIGS. 2(a) and (b) are depicted. An example that will be accommodated in the examples below is an on-axis illumination profile, for compatibility with existing marks and measurement methods. Referring firstly to the example of an on-axis mode, as used in the sensor of FIG. 3, illumination normal to the mark is provided by an on-axis illumination profile 448(O) having a central bright spot within an otherwise dark pupil 452, as seen in FIG. 5(a). This profile is an optional setting in the illumination beam 422 of the apparatus. In this example, it is desired for the zero order beam which returns along the optical axis to blocked before entry to interferometer 428, but also for it to be transferred to the asymmetry measuring arrangement 460 (when provided). To block the zero order before the interferometer is not essential, but improves the signal to noise ratio of the position signal. Accordingly, in this embodiment, a spot mirror 470 is included in the second beam splitter 462. The first splitter 454 is not silvered, and one accepts that only 50% or so of the intensity of the central spot may be transferred to the mark. In an alternative embodiment, where the arrangement 460 is omitted, this profile may be produced directly by illumination profiler 446 and transmitted at full intensity to objective 424 by a spot mirror within the first beam splitter 454. A variety of alternatives can be envisaged to obtain a desired profile.

The horizontal dotted line in FIGS. 5-8 represents the direction of periodicity of a mark being read, in this case an X direction mark. As seen in FIG. 5(b), diffraction spots of −1 and +1 order occurring in direction X will fall safely within the pupil of the optical system, so long as the grating pitch is λ/NA or less. The same is true for the cases of Y and XY marks (not illustrated). In general, an integer n may represent any diffraction order above zero. An alignment signal can be extracted when the +n order overlaps with the −n order. This is done using the self-referencing interferometer 428 that mixes +90° and −90° rotated copies of the incoming radiation field, giving the profile 482(O) seen at FIG. 5(c).

When off-axis illumination is used, bright spots of coherent radiation can be produced at peripheral positions, also illustrated in FIG. 4. The spots in the profile 448 are in two pairs, with 180° symmetry in each pair. The pairs are at 90° to one another, and located at 22.5° to the X and Y axes. The spots have a limited radial extent and a limited angular extent in the pupil plane. By providing such a pattern of spots, all three grating directions are be supported, either in a single illumination mode, or by modes which are readily selectable in the hardware. U.S. 61/623,391 discloses various methods of producing such profiles, including by spot mirrors and by use of a self-referencing interferometer of the same form as interferometer 428. As discussed already in the context of the on-axis illumination these spots could be matched by spot mirrors in beam splitter 454 so as to form the desired illumination profile 448 at the pupil plane P of objective lens 424 without wasting of radiation. In this embodiment, however, the spot mirrors 472 are placed instead in the splitter 462 as shown, so that they can deliver zero order diffracted beams to the asymmetry measuring arrangement 460.

The spots and spot mirrors are likely to be much smaller in practice than the large spots illustrated schematically here. For example, for a pupil diameter of a few centimeters, the spot size may be less than 1 millimeter. The optical system as shown is only presented for the discussion of an embodiment of the present invention, and additional components can be added in a practical implementation. As one example, one or more additional beam splitters can be provided in the path of information carrying beam 426, to collect portions of the radiation for other purposes. For example, another splitter with part-silvered spot mirrors could be placed between splitters 454 and 462, to collect some radiation for measurement of intensity. Alternatively or in addition, portions of the radiation can be collected in the arrangement 460 for similar purposes.

FIG. 6 shows (a) an off-axis illumination profile 448, (b) a diffraction pattern in the information carrying beam 426 and (c) an interferometer output 482 for an X-direction mark having almost half the pitch of the mark used in FIG. 5, where a suitable pair of spots of the available illumination spots are chosen to be illuminated. In this instance, despite the reduced pitch and consequently greater angle, the orders +1 and −1 fall within the pupil, sufficient for recognition of the mark position, and represents a lower limit for the grating pitch that is substantially λ/2NA, i.e. half what applied in the known instrument. The circle in each diagram again represents the pupil of the optical system, while the direction of periodicity in the mark is represented by the dotted line crossing the circle. In FIG. 6(a), two spots of illumination are positioned diametrically opposite one another, providing the illumination profile with 180° symmetry about the optical axis (O, not shown). (The skilled reader will understand that these spots exist in the pupil plane and are not to be confused with the spot on the mark itself, or in an image of the mark. On the other hand, 180° in the pupil plane is equivalent to 180° rotation in the image plane also.) The spots are not positioned on the X axis (dotted line), but rather offset from it by a small angle, in this example 22.5°. Consequently, the spots are offset from one another in a direction transverse to the X axis, that is to say, transverse to the direction of periodicity of the grating. At FIG. 6(b), the resulting diffraction pattern caused by the grating of the alignment mark 202 is depicted. For one spot, the diffraction order +1 is within the pupil. For the other spot, the diffraction order −1 is within the pupil, at a position 180° rotated from the order +1. A zeroth order diffraction (specular reflection) of each spot coincides exactly with the position of the other spot.

If the pitch of the grating were to increase, additional orders −2 and +2 etc. may fall within the pupil. Because of the offset mentioned already, the diffraction orders of each spot remain separate from those of the other spot, irrespective of the pitch of the grating. An apparatus can be envisaged in which the offset is not present, and the illumination spots lie exactly on the X, Y and/or XY axes. However such an arrangement may place constraints on the combinations of mark pitches and radiation wavelengths that can be used, if one is to avoid unwanted overlap between diffraction orders, and to avoid wanted diffraction orders being blocked. In an embodiment where broadband or polychromatic radiation is used, the higher order diffraction signals will not be a single spot, as shown here, but rather will be spread into a first order spectrum, second order spectrum and so forth. The potential for unwanted overlap between orders is thereby greater. The orders will be represented as spots here for simplicity only.

FIG. 6(c) shows the result of passing the diffraction signal at FIG. 6(b) through interferometer 428 that mixes +90° and −90°-rotated copies of the mark image. It is assumed that the 0th order spots are blocked by a field stop at some point prior to the interferometer. A simple implementation of such a field stop would be the spot mirrors 472, where provided. The positive and negative signals for each higher order are superimposed and become mixed as indicated by +1/−1, +2/−2, etc. Provided that the original illumination spots are coherent with one another, the effect is the same as the mixing of positive and negative orders of a single illumination spot. Accordingly the interferometer, detection optics and detection electronics of the position measuring apparatus can be the same as in the apparatus of FIG. 3. The processing of detected signals to obtain a position measurement can be substantially the same also.

The directions in which the higher order spots will be found in the diffracted radiation field are indicated for the X, Y and XY marks by white dotted lines on the profiles 448 and 448(0) as illustrated in FIG. 4. The illumination profile 448 in each mode has the properties: (i) each spot is limited in radial and angular extent and (ii) within each spot pair the spots are offset from one another in a direction transverse to any of the directions of periodicity of the X, Y or XY marks. Accordingly, higher order spots lying along these diffraction directions will not interfere with one another, at least in the middle part of the field. Adjustable field stop 490 can be provided to reduce the risk of overlap further, particularly where coarse marks are being measured. More detail of this is contained in U.S. 61/623,391 mentioned above.

The prior application further illustrates the diffraction patterns and interferometer outputs for illumination modes designed for a Y-direction mark (204 in FIG. 2(*a*)) and for an XY mark (210 in FIG. 2(*b*)). Everything that has been said above with respect to parts (a), (b) and (c) of FIGS. 5 and 6 applies equally to these parts. Because the XY mark has portions with different orientations of grating lines, each at 45° to the X and Y axes, two pairs of spots are provided in the illumination profile. As in the X and Y cases, the spots of each pair are positioned diametrically opposite one another, and slightly offset from one another in a direction transverse to the direction of periodicity of the grating. Note that the two pairs of spots do not need to be present at the same time when scanning the XY mark: each pair can be switched on for scanning the portion of the mark that has the corresponding direction of periodicity. If both pairs of spots are illuminated all the time while scanning the XY mark, then the diffraction orders received by the objective from the substrate will be only those corresponding to the direction of periodicity in the particular part of the mark being scanned for suitably small pitches.

The illumination profiles can be produced in a number of ways to form a practical instrument, bearing in mind that the opposed segments should be coherent for the interferometer 428 to produce the desired signal. Particularly when a broadband source is involved, the coherence length/time of the source radiation will be short. Even with a monochromatic laser source, U.S. Pat. No. 6,961,116 teaches that a short coherence time is desired, for example to eliminate interference from undesired multiple reflections. Consequently, optical path lengths from the source to each segment should be closely matched. An aperture corresponding directly to the desired profile could be placed in a widened parallel beam, but that would result in a relatively large radiation loss. To circumvent the loss of radiation, various alternative solutions in the U.S. 61/623,391 mentioned above are proposed.

The illumination emerging from the illumination source 442 may be monochromatic but is typically broadband in nature, for example white light, or polychromatic. A diversity of wavelengths in the beam increases the robustness of the measurement. The sensor may use, for example, a set of four wavelengths named green, red, near infrared and far infrared. In a sensor implementing an embodiment of the present invention, the same four wavelengths could be used, or a different four, or more or fewer than four wavelengths might be used.

The mark may need to be scanned more than once if it is desired for example to measure position using two different polarizations. Also the illumination mode may be switched midway through scanning the XY mark. In other embodiments, however, multiplexing of optical signals is used so that two measurements can be made simultaneously. Similarly, multiplexing can be applied so that different portions of the XY mark can be scanned and measured without switching illumination mode. A simple way to perform such multiplexing is by frequency division multiplexing. In this technique, radiation from each pair of spots and/or polarization is modulated with a characteristic frequency, selected to be much higher than the frequency of the time-varying signal that carries the position information. The diffracted and processed optical signals arriving at detector 430 will be a mixture of two signals, but they can be separated electronically using one or more filters tuned to the respective frequencies of the source radiation. Time division multiplexing could also be used, but this would involve accurate synchronization between source and detector. The modulation at each frequency can be a simple sine or square wave, for example.

If it is desired to illuminate a mark with circular polarization, whether for position sensing or some other form of metrology, a quarter wave plate (not shown) can be inserted between beam splitter 454 and objective 424. This has the effect of turning a linear polarization into a circular one (and changing it back again after diffraction by the mark). The spot positions are chosen as before according to the mark direction. The direction of circular polarization (clockwise/counterclockwise) can be changed by selecting a different linear polarization in the illumination source 420, fiber 422 or illumination profiling optic 446.

Figure 7:
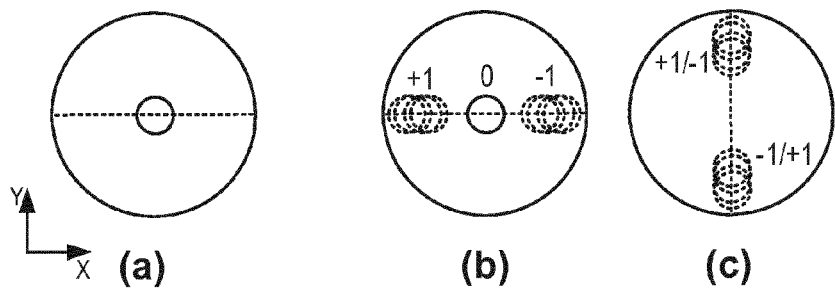
FIG. 7 illustrates (a) an on-axis illumination profile, (b) resulting diffraction signals, and (c) resulting self-referencing interferometer output for multiple wavelengths of radiation in one use of the position measuring apparatus of FIG. 4.
Figure 8:
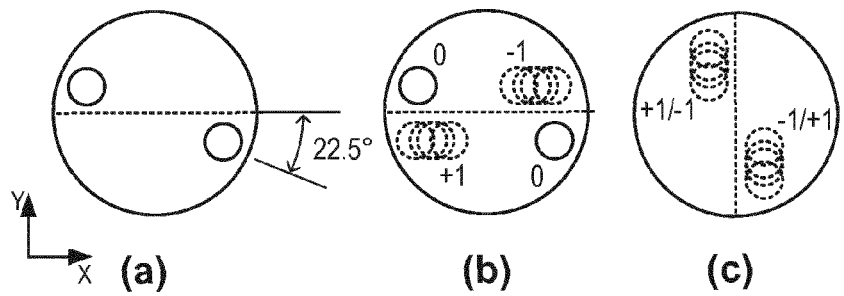
FIG. 8 illustrates (a) an off-axis illumination profile, (b) resulting diffraction signals, and (c) resulting self-referencing interferometer output for multiple wavelengths of radiation in one use of the position measuring apparatus of FIG. 4.

Referring briefly to FIGS. 7 and 8, these show (b) diffraction patterns and (c) interferometer outputs for the same illumination profiles (a) as were shown in FIGS. 5 and 6. The difference is that in FIGS. 7 and 8 it is assumed that the illumination contains a number of different wavelengths. As mentioned already, the alignment sensor may use, for example, a set of four wavelengths named green, red, near infrared and far infrared. These provide robust position readout from a range of marks, which may have to be read through overlying layers of different materials, different material properties and/or different thicknesses. Whereas the first order signals for monochromatic light appear as single spots in FIGS. 5 and 6, FIGS. 7 and 8 depict how the different wavelengths present in the illumination of the alignment sensor are spread into spectra. Where the illumination comprises several discrete wavelengths, and where the spots in practice are very much smaller than the spots illustrated here, the diffracted spots for the different colors will not necessarily overlap in the way that they are shown in FIGS. 7 and 8. They could be separated by providing an image sensor in a conjugate pupil plane, or by measuring the different colors sequentially, like in a scatterometer. However, an image sensor may be more prone to noise, each spot may cover only one pixel or less, and an image sensor may bring noise and heat dissipation that should be avoided if possible in the alignment sensing environment. Note that in the coarser pitch mark used in FIG. 8, the diffracted orders are significantly closer to the zero order spot at the center. In the off-axis illumination mode with a mark of finer pitch, the first orders for the different colors are more spread out, and further from the zero orders.

While the examples described herein concentrate on $0^{th}$ order and $+/-1^{st}$ order diffraction signals, it will be understood that the disclosure extends to the capture and analysis of higher orders, for example $+/-2^{nd}$ orders, more generally $+/-n^{th}$ orders. In the examples, the $1^{st}$ orders only are shown and discussed, for simplicity.

Figure 9:
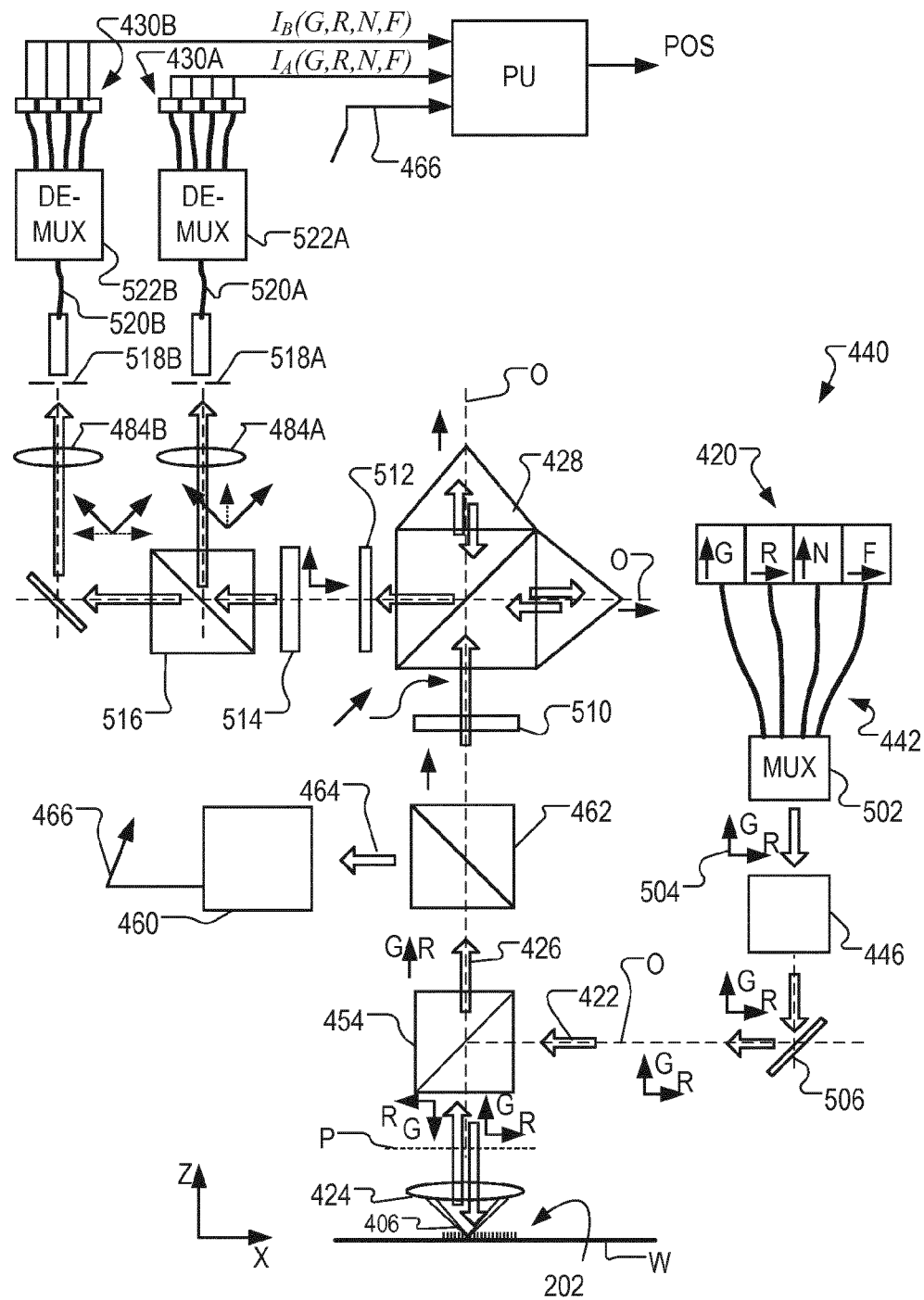
FIG. 9 is a further detailed schematic diagram of the apparatus of FIG. 4, showing features of multiple wavelengths and polarization, omitted from FIG. 4 for clarity.

FIG. 9 illustrates in more detail aspects of the apparatus of FIG. 4, concerned with measurement using multiple wavelengths of radiation, and concerned with the management of polarization effects. The same reference numbers are used for components seen in FIG. 4, while some of those components are seen here with details not seen in FIG. 4. In illumination subsystem 440, source 420 comprises, for example, four individual sources to provide radiation with four wavelengths named green (labeled G), red (R), near infrared (N) and far infrared (F). For convenience in the following discussion, the radiation at these four different wavelengths will be called four colors of light, it being immaterial for present purposes whether they are in the visible or non-visible parts of the electromagnetic spectrum. All the sources are linearly polarized, with the G and N radiation being oriented the same direction as one another, and the R and F radiation being polarized orthogonally to the G and N polarization.

The four colors are transported by polarization maintaining fiber to a multiplexer 502, where they are combined into a single four-color beam. The multiplexer maintains linear polarization, as indicated by arrows 504. The arrows 504 and similar arrows throughout the diagram are labeled G and R to indicate polarization of the green and red components. The N and F components are oriented the same as the G and R components, respectively.

This combined beam goes via suitable delivery optic 506 into beam splitter 454. As already described, the beam then reflects from a partially- or fully reflecting surface (e.g. a 0.5 mm dia spot mirror), which is inside the beam splitter. The objective lens 424 focuses the beam to a narrow beam which is reflected and diffracted by the grating formed by alignment mark 202 on the substrate. Radiation is collected by the objective, with for example numerical aperture NA=0.6. This NA value may allow at least ten orders of diffraction to be collected from a grating with 16 μm pitch, for each of the colors.

The reflected and diffracted radiation forming information carrying beam 426 is then transported to the self-referencing interferometer 428. In this example, as already described, the beam is split 462 to supply a portion 464 of the information carrying beam to the asymmetry measuring arrangement 460, when provided. Signals 466 conveying asymmetry measurement information are passed from arrangement 460 to the processing unit PU. Just before the interferometer, polarization is rotated by 45° by a half wave plate 510. From this point on, polarization arrows are shown for only one color, for clarity. The interferometer, as already described above and in U.S. Pat. No. 6,961,116, comprises a polarizing beam splitter, where half of each color is transmitted, and half of each color is reflected. Each half then is reflected three times inside the interferometer, rotating the radiation field by +90° and −90°, giving a relative rotation of 180°. The two fields are then superimposed on top of each other and allowed to interfere. A phase compensator 512 is present to compensate for path differences of the −90° and 90° image. The polarization is then rotated 45° by another half wave plate 514 (having its major axis set at 22.5° to the X or Y axis). The half wave plates 510, 514 are substantially wavelength insensitive, so that polarizations of all four wavelengths are rotated by 45°.

A further beam splitter 516 (not shown in FIG. 4) splits the optical signal into two paths designated A and B. One path contains the sum of the two rotated fields, and the other contains the difference. Depending on the initial polarization direction, the sum ends up in path A or path B. So in this example the sum signals for G and N end up in one path, and R and F in the other. For each color, the corresponding difference signal ends up in the other path.

Note that this arrangement chooses to use one polarization for illumination in each color. Measurements with two polarizations per color could be made, by changing the polarization between readings (or by time division multiplexing within a reading). However, to maintain high throughput while benefiting from some diversity in color and polarization, a set of different colors with single, but different, polarizations represents a good compromise between diversity and measurement throughput. To increase diversity without impacting throughput, one can envisage an implementation similar to the four-color scheme presented here, but using more colors, for example eight or sixteen, with mixed polarizations.

The radiation for each path A and B is collected by a respective collector lens assembly 484A and 484B. It then goes through an aperture 518A or 518B that eliminates most of the radiation from outside the spot on the substrate. Multimode fiber 520A and 520B transports the collected radiation of each path to a respective demultiplexer 522A and 522B. The demultiplexer splits each path in the original four colors, so that a total of eight optical signals are delivered to detectors 430A and 430B. In one practical embodiment, fiber goes from the demultiplexer to eight detector elements on a detector circuit board. The detectors provide no spatial resolution, but deliver time-varying intensity signals $I_A$ and $I_B$ for each color, as the apparatus scans the mark 202. The signals are actually position-dependent signals, but received as time-varying signals (waveforms) synchronized with the physical scanning movement between the apparatus and the mark (recall FIG. 3).

Processing unit PU receives the intensity waveforms from the eight detectors and processes them to provide a position measurement POS. Because there are eight signals to choose from, based on different wavelengths and incident polarizations, the apparatus can obtain useable measurements in a wide variety of situations. In this regard it should be remembered that the mark 202 may be buried under a number of layers of different materials and structures. Some wavelengths will penetrate different materials and structures better than others. Processing unit PU conventionally processes the waveforms and provides a position measurement based on the one which is providing the strongest position signal. The remaining waveforms may be disregarded. In a simple implementation, the 'recipe' for each measurement task may specify which signal to use, based on advance knowledge of the target structure, and experimental investigations. In more advanced systems, for example as described in the paper by Huijbregtse et al. mentioned above, an automatic selection can be made, using "Color Dynamic" or "Smooth Color Dynamic" algorithms to identify the one or more best signals without prior knowledge.

'Discarded' waveforms, when considered together as a set, may contain useful information about the structure and materials. In particular, they may contain information about asymmetry of the structure, which will be exploited to provide an alternative or additional asymmetry measurement technique as described further below. In addition, the set of signals can contain other information on the 'stack', that is the sequence of layers lying on top of the mark, and possibly beneath it as well. It will be appreciated that by using more of the information present in these existing signals, the proposed technique makes more efficient use of the total amount of photons reflected and diffracted by the substrate.

Also described in the Huijbregtse et al. paper is the use of multiple gratings in a composite target. Each grating has a different profile, enhancing for example higher diffraction orders ($3^{rd}$, $5^{th}$, $7^{th}$). Position measurements can be derived from different ones of these gratings, as well as from different color signals on an individual grating. In the present disclosure, it will be assumed that there is a single grating with a simple bar pattern. The skilled reader can readily expand the disclosure to envisage embodiments having multiple gratings with different patterns.

Asymmetry Measurement—Introduction

As described so far, the position measurement apparatus is used for example to obtain an alignment position in a lithographic apparatus such as that shown in FIG. 1. An error may be made when the alignment mark is asymmetric. The alignment error caused by an asymmetric alignment mark can contribute to the overlay error in devices made using the measurements in operation of the lithographic apparatus. By adding an asymmetry detection function to the position measurement apparatus, asymmetry of the mark can be measured using much of the same hardware as the position measurement, and simultaneously with the position measurement if desired. This measurement raises the possibility to correct the alignment error caused by asymmetry, during alignment of the lithographic apparatus. The following are some techniques that may be used in combination with an embodiment of the invention.

Metrology tools are available commercially to measure asymmetry. However, these may neither be integrated with the alignment sensor nor may they be fast enough to operate with the alignment sensor without harming throughput of a lithographic process. One such apparatus is an angle-resolved scatterometer that uses a CCD-array in a conjugate pupil plane to measure the intensity asymmetry in a diffraction spectrum. The scatterometer measures asymmetry sequentially for a number of colors. In the alignment sensor, the positions signals from different colors may be measured in parallel for speed. Additionally, speed, noise and power (heat) dissipation may present challenges to the asymmetry measuring arrangement, if it is to be integrated in an alignment senor.

Several different approaches are possible for adding an asymmetry measuring function to the position measuring apparatus. As mentioned already, an asymmetry measuring arrangement 460 may be included in the apparatus, which processes a portion 464 of the information carrying beam 426 diverted by beam splitter 462. The form of the asymmetry measuring apparatus 460 can vary.

In U.S. 61/623,391 mentioned above, there is mentioned an asymmetry measuring arrangement that includes a camera to capture pupil plane images of the diffracted radiation. These images can be used for angle-resolved scatterometry. By comparing intensities of image portions corresponding to positive and negative orders of diffraction, asymmetry can be measured. The option to add such a pupil image camera as an asymmetry measuring arrangement in an alignment sensor is discussed U.S. 61/623,391. U.S. 61/623,391 mentions another technique for measuring asymmetry through the interferometer and detector 430. This uses illumination profiles in which off-axis illumination is provided from one side only at a time, allowing the apparatus to measure the intensity of the +1 order and −1 order separately from one another.

In US patent application no. U.S. 61/684,006, filed 16 Aug. 2012, the contents of which is incorporated herein in its entirety by reference, a further form of asymmetry measuring arrangement 460 is proposed. In this form of arrangement, the illumination spot on the substrate is imaged onto a detector. Special optical elements are included in the optical path prior to imaging, which deflect positive and negative diffraction orders so that radiation of the different diffraction orders is separated and used to image the spot onto separate detectors.

Any of the arrangements just mentioned can be used to implement an asymmetry measuring arrangement 460 in the present apparatus. The following description concerns a further technique for measuring asymmetry, using the existing position measuring hardware. This technique may be used instead of or in combination with the arrangement 460, which may take either (or both) of the forms described in the mentioned prior applications, or may take another form entirely.

Asymmetry Measurement from Position Signals

Figure 10:
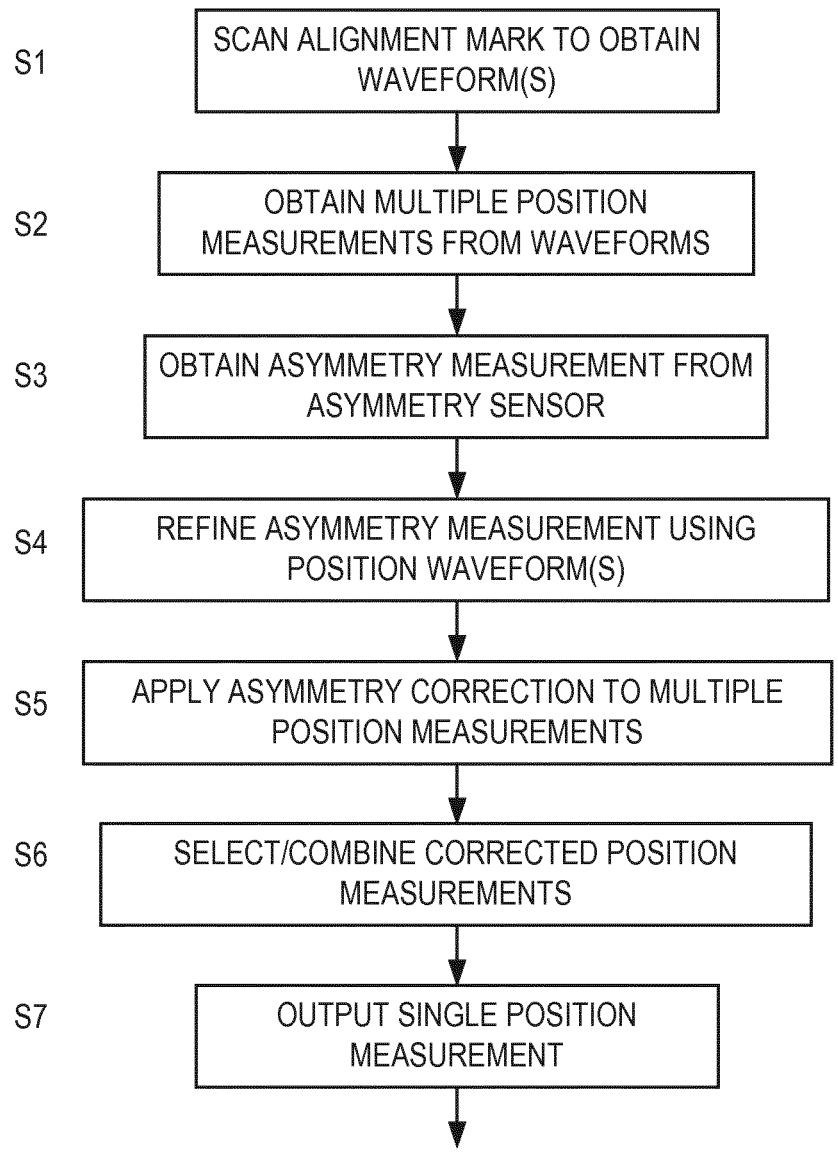
FIG. 10 is a flowchart of a method of measuring asymmetry and measuring position, according to an embodiment of the present invention.

FIG. 10 illustrates a method of measuring position of a mark which includes a method of measuring asymmetry based on position information. Alternative methods are possible within the scope of the present disclosure. In particular, the steps of this method can be implemented in combined forms, and do not necessarily need to be performed separately and sequentially, as presented here.

In step S1, the mark is scanned as described above, and multiple waveforms are recorded, according to the different colors, polarizations and/or the like that are accessible in the optical system. Referring to the example of FIG. 9, eight waveforms will be obtained per mark, corresponding to four color/polarization combinations and two complementary waveforms per color (sum and difference signals from branches A and B). Different implementations can yield different waveforms. In step S2, multiple position measurements are obtained from one or more of the waveforms in a manner which can be, for the sake of this example, a conventional manner. Within each color waveform there are also multiple position signals, based on different periodic components (harmonic orders), so that a great number of different candidate position measurements are actually available in practice (several tens). At this point, it would be possible to obtain a single position measurement by judging which of the position signals contains the strongest position-dependent variation and/or the best signal to noise ratio. In the embodiment described here, the selection or calculation of a single position measurement will be deferred until after all the candidate measurements have been corrected for asymmetry (see step S6).

In step S3 asymmetry information is obtained from the asymmetry measuring arrangement 460 (asymmetry sensor for short). Asymmetry information may be obtained alternatively or additionally from some source external to the position measuring apparatus.

In step S4, rather than discarding additional information from the multiple position signals derived from the waveforms captured in step S1, information from multiple signals is used to obtain a refined measurement of asymmetry or an asymmetry-dependent parameter. The manner in which this is done can vary, and examples will be explained further below. Increasing the measured information used can be beneficial to help 'break' unknown correlations between measured alignment position and various parameters of the target grating parameter. It can also increase the total number of photons used, and hence the signal to noise ratio will be improved.

At step S5, the refined asymmetry measurement derived in step S4 is used to apply a correction to each of the positions measured in step S2. In step S6, a "best" measured position is calculated by selecting and/or combining results from among the multiple corrected position measurements. This measurement, which has improved accuracy due to reduced asymmetry sensitivity, is output S7 either for use in a lithographic process, or more generally as a metrology result.

Figure 11:
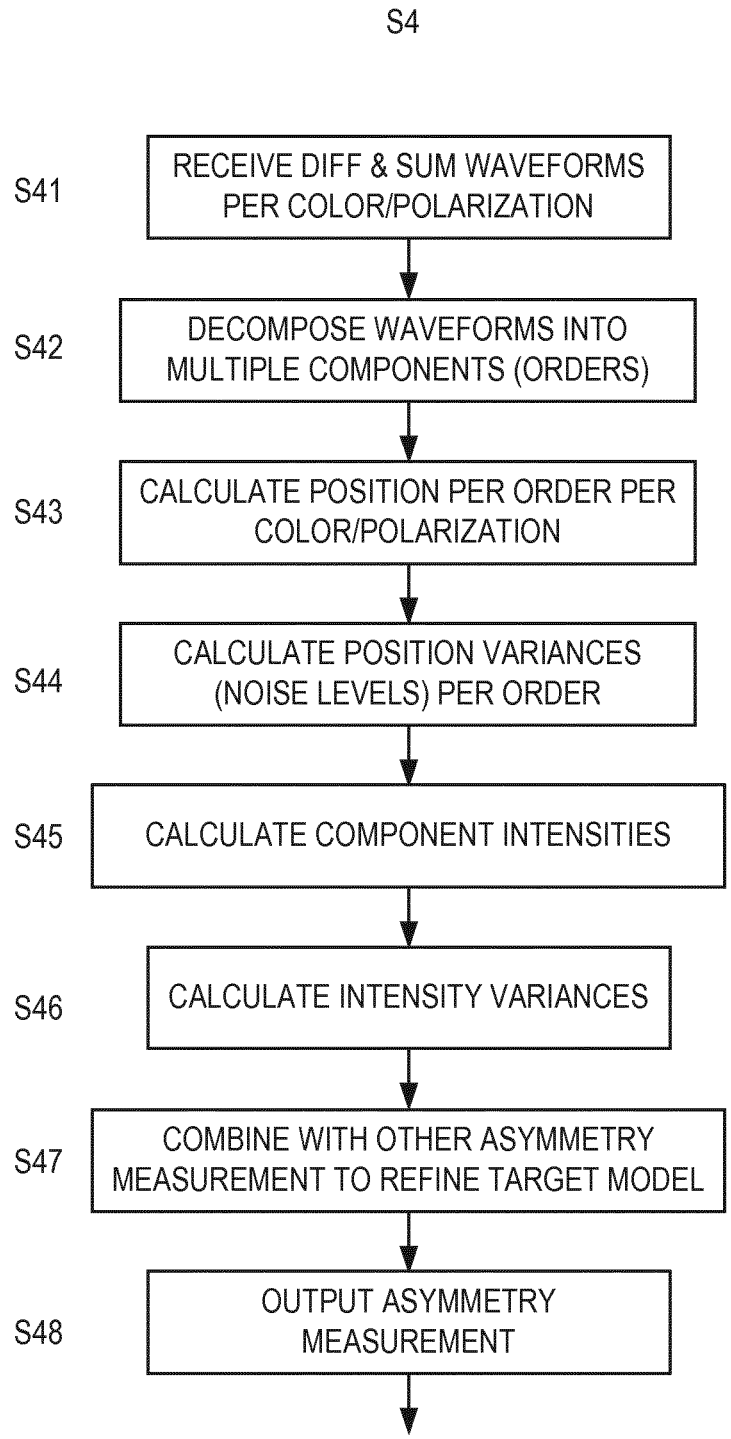
FIG. 11 is a more detailed flowchart of part of the method of FIG. 10 showing more detail of measuring asymmetry using position measurement signals in the apparatus of FIGS. 4 and 9.

FIG. 11 gives more detail of step S4 in which asymmetry measurement is obtained from the multiple waveforms collected by the position sensing apparatus. Steps within step S4 will be numbered S41, etc. As already mentioned, some of the processing can be performed together with processing for steps S2 and S3, and need not be separated and performed sequentially. Similarly, processing for the sub-steps S41, etc. does not need to be performed separately and sequentially in the manner implied by the flowchart. The flowchart is merely present as an aid to description of the overall method of one exemplary embodiment.

In step S41 the waveforms (position-dependent intensity signals) from the eight elements (in this example) of detectors 430A, 430B are received. At step S42, each waveform is decomposed into separate components. For example, a discrete Fourier transform (DFT) may be used to decompose the waveform into a set of component waveforms that are essentially harmonics of the period of the grating forming the mark 202. If the waveform were purely sinusoidal with period P/2, then only a first order component would have any magnitude. In a real target and a real instrument, however, several odd and even harmonics may be present in different phases and amplitudes. As described in the Huijbregtse et al. paper mentioned above, different target gratings may even be designed specifically to introduce strong higher-order signals. These multiple orders will be exploited to learn more about the structure of the target (including overlying stack layers). The result of step S42 is thus a set of numerous components, of different orders, but also of different colors/polarization combinations. Each of these components in principle can yield a position measurement. Therefore taking for example five orders for each of the eight waveforms will yield 40 different position measurements.

In step S43 a position measurement is calculated from each of the multiple components (color/polarization and order), which in practice is a matter of sharing the results already calculated in step S2 (FIG. 10). In step S44 a variance (noise estimate) is calculated for each position measurement, based on understanding of the shape of the grating and the observed signals. Besides position information, the component signals derived from the waveforms may contain other information that can be used to refine a model of the target structure. In the example described here, step S43 relies on a phase characteristic of the waveform components to calculate position. By contrast, in step S45 the processor analyzes intensity information of the different components, to obtain additional information that can be used to refine the target model. In step S46 the processor calculates variance of the intensity information.

In step S47, the numerous different position measurements are combined with a model of the target structure (mark 202) to identify best fitting parameters of that model. In particular, for the purposes of asymmetry measurement, an asymmetry-dependent parameter is included in the model. The variance calculated in step S44 is used as a measure of the quality of the corresponding position measurement obtained in step S43. Similarly, the variance calculated in step S46 is used as a measure of the quality of the corresponding intensity-based measure obtained in step S45. All of these results in turn are weighed against the asymmetry measurement per color/polarization and order that was obtained from the asymmetry sensor to obtain a single "best" measurement of asymmetry, which is then output at step S48.

Exemplary Implementation

A particular implementation of the above method steps will now be illustrated in mathematical detail. It should be understood that the above method steps are not the only way to implement asymmetry measurement and position measurement in accordance with an embodiment of the present invention. Moreover the mathematical detail below is not the only way to implement the above method steps in practice.

To facilitate the description and implementation of the asymmetry measurement technique, an alignment sensor model is defined and will be used throughout this document as an example. For convenience the same coordinate systems will be used as for the basic operation of the position measuring apparatus and associated asymmetry measuring arrangement 460. Firstly, the spatial coordinate system at target (substrate) level and the polarization coordinate level at pupil level are defined. Let $\underline{\hat{x}}_P$, $\underline{\hat{y}}_P$ and $\underline{\hat{z}}_P$ denote the pupil spatial Cartesian coordinate system unit vectors. Let $\underline{\hat{x}}_T$, $\underline{\hat{y}}_T$ and $\underline{\hat{z}}_T$ denote the target spatial Cartesian coordinate system unit vectors. Note that the intensity detectors 430A, 430B are located in planes conjugate to the target plane. Depending on the design of asymmetry measuring arrangement 460, intensity detectors there may be in a pupil plane or a target plane.

Figure 12:
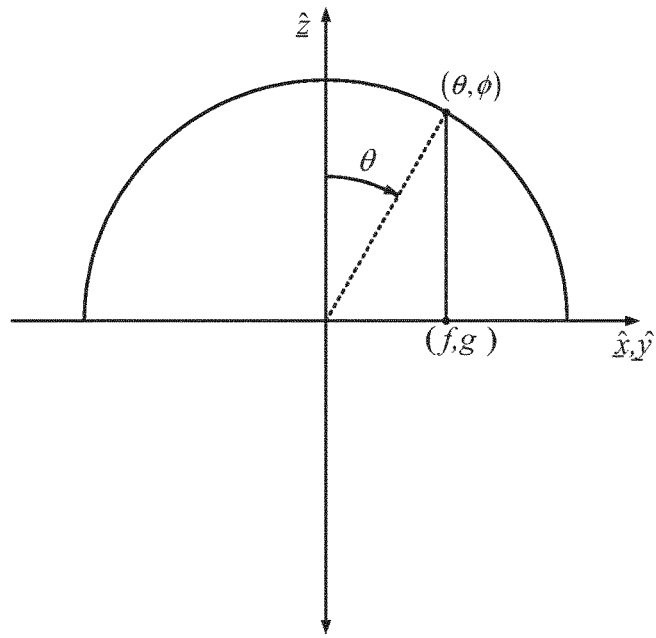

FIG. 12 illustrates some notation of coordinate systems geometry. Both Cartesian and spherical coordinate systems may be useful at different points in the model and calculations, and suitable transformations will be defined for converting data between the coordinate systems. Notation (θ, ϕ) denotes a coordinate on a spherical coordinate system (i.e. a coordinate on the unit half sphere). Note that alternative notation (θ,ϕ) will also be used for reasons which will become clearer later. Notation (f, g) denotes a coordinate on a polar coordinate system (i.e. a coordinate on the unit disk). Note that the $\hat{z}$ axis is either facing upwards or downwards as specified later in more detail.

Figure 13:
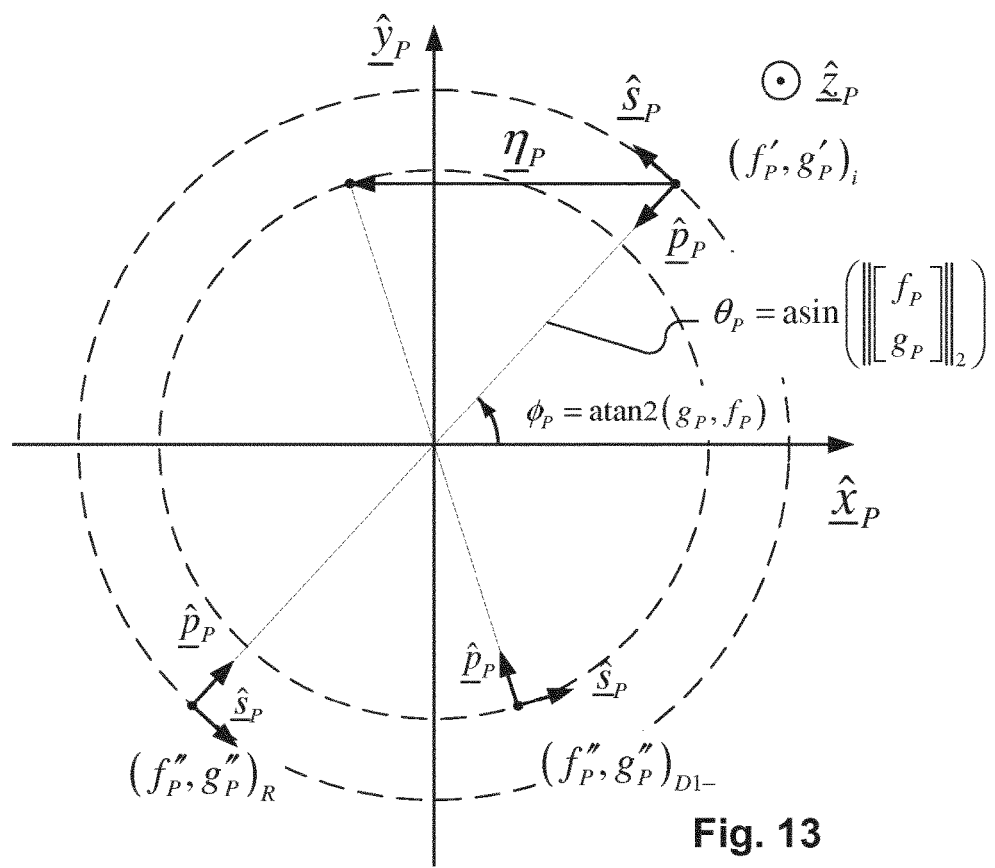

FIG. 13 illustrates notation in a pupil coordinate system, when viewing in the direction of $-1 \cdot \underline{\hat{z}}_P$ (i.e the negative spatial coordinate z unit vector). FIG. 14 illustrates notation in a target coordinate system, when viewing in the direction of $\underline{\hat{z}}_T$ (i.e. the positive spatial coordinate z unit vector). In addition to spatial coordinate systems, there are polarization coordinate systems, as the skilled person will understand. For simplicity throughout this description it is assumed that the target grating (alignment mark 202) is a one-dimensional periodic grating and is periodic with period (pitch) P in the $\underline{\hat{x}}_T$ direction only (typical values of pitch for this application are 500 nm≤P≤20000 nm). The geometry and calculations can be adapted by the skilled person for measuring the Y mark and XY marks 206, 210.

With reference to the notation introduced in FIGS. 12 to 18, the following terms are defined:

$$\underline{\eta}_T = \begin{bmatrix} -\frac{\lambda_0}{P} \\ 0 \end{bmatrix}$$

denotes the grating vector. Note that the length of the grating vector $\underline{\eta}_T$ is defined in unit [sine angle] (which is a direct consequence of the grating equation). Note that, for the purposes of the present description, the grating vector always points in the direction of $-1 \cdot \underline{\hat{x}}_T$.

(f'$_T$, g'$_T$) denotes the incident ray (i.e. a plane wave) pupil coordinate in the target spatial Cartesian coordinate system (in unit [sine angle]).

(f''$_T$, g''$_T$)$_0$ and (f''$_T$, g''$_T$)$_{-1}$ denote respectively the reflected (zeroth order) and minus first order diffracted ray (i.e. a plane wave) pupil coordinate, in the target spatial Cartesian coordinate system (in unit [sine angle]).

(θ'$_T$,ϕ''$_T$) denotes the position of the incident ray in the target spatial spherical coordinate system.

$(\theta''_T, \phi''_T)$ denotes the position of the reflected/diffracted ray in the target spatial spherical coordinate system.

$\underline{\hat{s}}_T$ and $\underline{\hat{p}}_T$, denote "senkrecht" and parallel unit vectors, of the target polarization coordinate system.

Similar notation with subscript P instead of T applies to the pupil coordinate system illustrated in FIG. 13. Note that the definition of the target polarization coordinate system as proposed above is discontinuous in the origin.

In a real implementation, allowances may need to be made for tilt relative to the apparatus coordinate system, and rotation about the Z axis. FIG. 15 illustrates notation for a tilt around the $\hat{y}_P$ axis, while FIG. 16 illustrates notation for a tilt around the $\hat{x}_P$ axis. In FIG. 15, $\rho_{\hat{y}_P}$ denotes the target tilt around the $\hat{y}_P$ axis in unit [rad]. From the figure the following relation can be derived:

$$\cos(\phi_P)\cdot\theta_P = \cos(\pi-\phi_T)\cdot\theta_T + \rho_{\hat{y}_P}.$$

In FIG. 16, $\rho_{\hat{x}_P}$ denotes the target tilt around the $\hat{x}_P$ axis in unit [rad]. From the figure the following relation can be derived:

$$\sin(\phi_P)\cdot\theta_P = \sin(\pi-\phi_T)\cdot\theta_T - \rho_{\hat{x}_P}.$$

Figure 17:
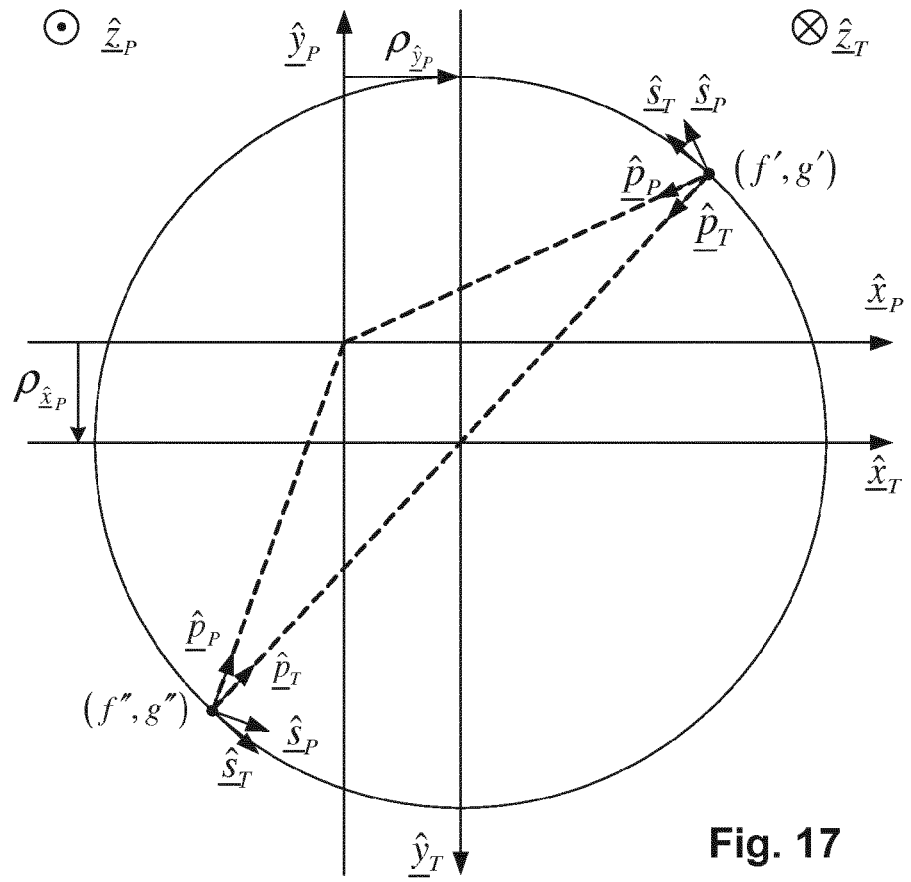

FIG. 17 illustrates the influence of the target tilts on the polarization coordinate systems. From the figure the following relations can be derived:

$$\begin{cases} f_P = f_T + \rho_{\hat{y}_P} \\ g_P = -g_T - \rho_{\hat{x}_P} \end{cases}.$$

Figure 18:
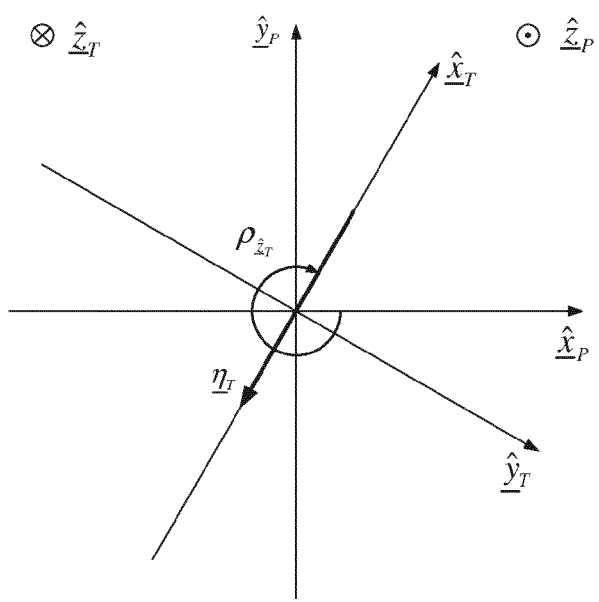

In FIG. 18 $\rho_{\hat{z}_T}$ denotes the target rotation in unit [rad]. Note that alignment target rotations of $\rho_{\hat{z}_T} = \{-45°, 0°, 45°, 90°\}$ are common. Note that the target polarization coordinate system $\hat{p}_T$ and $\hat{s}_T$, is invariant under rotation (around the $\hat{z}_T$ axis).

Coordinate system transformations from the pupil spatial polar coordinate system to the target spatial spherical coordinate system and vice versa can be derived. Without going into the detailed derivation, the mapping SP2T: $(\theta_P, \phi_P) \to (\theta_T, \phi_T)$ (Spatial Pupil To Target) can be shown to be $$(\theta_T, \phi_T) = SP2T(\theta_P, \varphi_P, \rho_{\hat{x}_P}, \rho_{\hat{y}_P}, \rho_{\hat{z}_T})$$

$$= \begin{cases} \phi_T = \begin{cases} \pi - \mathrm{atan2}(b, a) + \rho_{\hat{z}_T} & \text{if } \theta_T > 0 \\ 0 & \text{if } \theta_T = 0 \end{cases} \\ \theta_T = \sqrt{a^2 + b^2} \\ a = \cos(\varphi_P)\cdot\theta_P - \rho_{\hat{y}_P} \\ b = \sin(\varphi_P)\cdot\theta_P + \rho_{\hat{x}_P} \end{cases}.$$

The mapping ST2P: $(\theta_T, \phi_T) \to (\theta_P, \phi_P)$ (Spatial Target To Pupil) can be shown to be $$(\theta_P, \varphi_P) = ST2P(\theta_T, \phi_T, \rho_{\hat{x}_P}, \rho_{\hat{y}_P}, \rho_{\hat{z}_T})$$

$$= \begin{cases} \varphi_P = \begin{cases} \mathrm{atan2}(\beta, \alpha) & \text{if } \theta_P > 0 \\ 0 & \text{if } \theta_P = 0 \end{cases} \\ \theta_P = \sqrt{\alpha^2 + \beta^2} \\ \alpha = \cos(\pi - \phi_T + \rho_{\hat{z}_T})\cdot\theta_T + \rho_{\hat{y}_P} \\ \beta = \sin(\pi - \phi_T + \rho_{\hat{z}_T})\cdot\theta_T - \rho_{\hat{x}_P} \end{cases}.$$

(Note that the subscript 'P' here indicates pupil plane, and is not to be confused with the variable P that is the period of the target grating.)

Further, coordinate system transformations from the incident ray in the target spherical coordinate system to the reflected/diffracted ray in the target spherical coordinate system can be derived. The unknown mapping SI2RD: $(\theta'_T, \phi'_T, n) \to (\theta''_T, \phi''_T)$ (Spatial Incident To Reflected/Diffracted) can be derived as the following:

$$(\theta''_T, \phi''_T) = SI2RD(\theta'_T, \phi'_T, \lambda_0, P, \nu)$$

$$= \begin{cases} \theta''_T = \begin{cases} \mathrm{asin}\left(\sqrt{f''^2_T + g''^2_T}\right) & \text{if } \sqrt{f''^2_T + g''^2_T} \leq 1 \\ \mathrm{asin}(1) & \text{otherwise} \end{cases} \\ \phi''_T = \mathrm{atan2}(g''_T, f''_T) + \pi \\ f''_T = \cos(\phi'_T)\cdot\sin(\theta'_T) - \dfrac{\nu\cdot\lambda_0}{P} \\ g''_T = \sin(\phi'_T)\cdot\sin(\theta'_T) \end{cases}.$$

In this transformation: $\nu \in \{-N, N\}$ denotes the diffraction order (noting that $\nu=0$ refers to the reflected order, and $\nu \neq 0$ refers to the diffracted (higher) orders); $P > 0$ again denotes the target grating pitch and $\lambda_0 > 0$ denotes the incident plane wave wavelength in vacuum (typical values for this application are 400 nm $\leq \lambda_0 \leq$ 1100 nm).

Note that the radial coordinate $\sqrt{f''^2_T + g''^2_T}$ is clipped to one.

Coordinate system transformations from the pupil polarization coordinate system to the target polarization coordinate system and vice versa can be derived. First, the counterclockwise rotation matrix is defined as:

$$\underline{\chi}(\chi) = \begin{bmatrix} \cos(\chi) & -\sin(\chi) \\ \sin(\chi) & \cos(\chi) \end{bmatrix}.$$

The unknown mapping PP2T: $(\hat{p}_P, \hat{s}_P) \to (\hat{p}_T, \hat{s}_T)$ (Polarization Pupil To Target) can be derived as:

$$(\hat{p}_T, \hat{s}_T) = PP2T(\hat{p}_P, \hat{s}_P)$$

$$= \begin{cases} \hat{p}_T = \underline{\chi}_{P2T}(f_T, g_T, \rho_{\hat{x}_P}, \rho_{\hat{y}_P})\cdot\hat{p}_P \\ \hat{s}_T = \underline{\chi}_{P2T}(f_T, g_T, \rho_{\hat{x}_P}, \rho_{\hat{y}_P})\cdot\hat{s}_P \\ \underline{\chi}_{P2T}(f_T, g_T, \rho_{\hat{x}_P}, \rho_{\hat{y}_P}) = \begin{bmatrix} \cos(\chi_{P2T}) & -\sin(\chi_{P2T}) \\ \sin(\chi_{P2T}) & \cos(\chi_{P2T}) \end{bmatrix} \\ \chi_{P2T} = \mathrm{atan2}(-g_T, f_T) - \mathrm{atan2}(-g_T - \rho_{\hat{x}_P}, f_T + \rho_{\hat{y}_P}) \end{cases}.$$

The mapping PT2P: $(\hat{p}_T, \hat{s}_T) \to (\hat{p}_P, \hat{s}_P)$ (Polarization Target To Pupil) can be derived as:

$$(\underline{\hat{p}}_P, \hat{s}_P) = PT2P(\underline{\hat{p}}_T, \hat{s}_T)$$

$$= \begin{cases} \underline{\hat{p}}_P = \underline{\underline{X}}_{T2P}(f_T, g_T, \rho_{\hat{x}_P}, \rho_{\hat{y}_P}) \cdot \underline{\hat{p}}_T \\ \hat{s}_P = \underline{\underline{X}}_{T2P}(f_T, g_T, \rho_{\hat{x}_P}, \rho_{\hat{y}_P}) \cdot \hat{s}_T \\ \underline{\underline{X}}_{T2P}(f_T, g_T, \rho_{\hat{x}_P}, \rho_{\hat{y}_P}) = \left(\underline{\underline{X}}_{P2T}(f_T, g_T, \rho_{\hat{x}_P}, \rho_{\hat{y}_P})\right)^T \\ \underline{\underline{X}}_{P2T}(f_T, g_T, \rho_{\hat{x}_P}, \rho_{\hat{y}_P}) = \begin{bmatrix} \cos(\chi_{P2T}) & -\sin(\chi_{P2T}) \\ \sin(\chi_{P2T}) & \cos(\chi_{P2T}) \end{bmatrix} \\ \chi_{P2T} = \text{atan2}(-g_T, f_T) - \text{atan2}(-g_T - \rho_{\hat{x}_P}, f_T + \rho_{\hat{y}_P}) \end{cases}$$

The mapping PPPS2XY: $(\underline{\hat{p}}_P, \hat{s}_P) \to (\underline{\hat{x}}_P, \underline{\hat{y}}_P)$ (Polarization Pupil Parallel Senkrecht To X Y) can be derived as:

$$(\underline{\hat{x}}_P, \underline{\hat{y}}_P) = PPPS2XY(\underline{\hat{p}}_P, \hat{s}_P)$$

$$= \begin{cases} \underline{\hat{x}}_P = \underline{\underline{\Gamma}}_{ps2xy}(g_P, f_P) \cdot \underline{\hat{p}}_P \\ \underline{\hat{y}}_P = \underline{\underline{\Gamma}}_{ps2xy}(g_P, f_P) \cdot \hat{s}_P \\ \underline{\underline{\Gamma}}_{ps2xy}(g_P, f_P) = \begin{bmatrix} -1 & 0 \\ 0 & 1 \end{bmatrix} \cdot \underline{\underline{X}}_{ps2xy}(g_P, f_P) \\ \underline{\underline{X}}_{ps2xy}(g_P, f_P) = \begin{bmatrix} \cos(\chi_{ps2xy}) & -\sin(\chi_{ps2xy}) \\ \sin(\chi_{ps2xy}) & \cos(\chi_{ps2xy}) \end{bmatrix} \\ \chi_{ps2xy} = -1 \cdot \text{atan2}(g_P, f_P) \end{cases}$$

The mapping PPXY2PS: $(\underline{\hat{x}}_P, \underline{\hat{y}}_P) \to (\underline{\hat{p}}_P, \hat{s}_P)$ (Polarization Pupil X Y To Parallel Senkrecht) can be derived as:

$$(\underline{\hat{p}}_P, \hat{s}_P) = PPXY2PS(\underline{\hat{x}}_P, \underline{\hat{y}}_P)$$

$$= \begin{cases} \underline{\hat{p}}_P = \underline{\underline{\Gamma}}_{xy2ps}(g_P, f_P) \cdot \underline{\hat{x}}_P \\ \hat{s}_P = \underline{\underline{\Gamma}}_{xy2ps}(g_P, f_P) \cdot \underline{\hat{y}}_P \\ \underline{\underline{\Gamma}}_{xy2ps}(g_P, f_P) = \left(\underline{\underline{\Gamma}}_{ps2xy}(g_P, f_P)\right)^T \\ \underline{\underline{\Gamma}}_{ps2xy}(g_P, f_P) = \begin{bmatrix} -1 & 0 \\ 0 & 1 \end{bmatrix} \cdot \underline{\underline{X}}_{ps2xy}(g_P, f_P) \\ \underline{\underline{X}}_{ps2xy}(g_P, f_P) = \begin{bmatrix} \cos(\chi_{ps2xy}) & -\sin(\chi_{ps2xy}) \\ \sin(\chi_{ps2xy}) & \cos(\chi_{ps2xy}) \end{bmatrix} \\ \chi_{ps2xy} = -1 \cdot \text{atan2}(g_P, f_P) \end{cases}$$

Having defined coordinate systems and transformations, it is assumed that the (complex) pupil plane electric field amplitudes are known/given. These (complex) pupil plane electric field amplitudes can be computed using any suitable approach. In the present implementation, a Jones calculus model is used to compute these fields given the illumination field (in terms of wavelength, angle and polarization) and given coefficients of reflection and diffraction of the target structure (alignment mark, substrate and overlying stack). These coefficients can be computed by solving Maxwell's equations for a model of the target and surrounding materials. The equations can be solved for example by the well-known technique of RCWA (rigorous coupled-wave analysis). This (complex) pupil plane electric field amplitude, in the $\underline{\hat{x}}_P$ and $\underline{\hat{y}}_P$ polarization coordinate system, can be denoted by the following equation $$E_{P,v} = \begin{bmatrix} E_{P,v,\hat{x}_P} \\ E_{P,v,\hat{y}_P} \end{bmatrix}.$$

Again, $v \in \{N,N\}$ denotes the diffraction order, $v=0$ refers to the reflected order, and $v \neq 0$ refers to the diffracted orders. How to calculate the intensity as seen by the detectors 430A, 430B in the alignment sensor will now be discussed. As mentioned already, the case of off-axis illumination will be considered. The case of on-axis illumination can be derived as a special case. Note that in the off-axis illuminated alignment sensor, both illumination rays (spots in the pupil plane) are mutually coherent and in phase. Hence the (complex) electric field amplitudes, of positive and negative diffraction orders, as summed below, may originate from a different incident plane wave. Note it will be assumed here that the target tilts are zero.

The (complex) pupil plane electric field amplitude, as a function of the (stage) scan position equals $$E_{P,v}(x_{stage}) = \exp\left(\frac{-i \cdot 2 \cdot \pi \cdot v \cdot x_{stage}}{P}\right) \cdot E_{P,v}(x_{stage} = 0).$$

where $x_{stage}$ denotes the scan x-position of, for example, the substrate table WT. Note that it is assumed here that the scanning movement is pointing in the direction of (i.e. parallel to) the $\underline{\hat{x}}_P$ direction. Again, P>0 denotes the target grating pitch.

Note that the phase term exp $$\left(\frac{-i \cdot 2 \cdot \pi \cdot v \cdot x_{stage}}{P}\right)$$

as introduced above, can be derived from a Fourier optics treatment (i.e. a Fourier series expansion) of the alignment target. The counterclockwise rotation matrix is defined again to equal $$\underline{\underline{X}}(\chi) = \begin{bmatrix} \cos(\chi) & -\sin(\chi) \\ \sin(\chi) & \cos(\chi) \end{bmatrix}.$$

The (complex) electric field amplitudes, after passing, in order, the half-wave plate 510, the self-referencing interferometer 428 and the phase compensator 512, are the following:

$$\begin{cases} \underline{E}_{U,v}(x_{stage}) = \underline{\underline{X}}(90°) \cdot \begin{bmatrix} 1 & 0 \\ 0 & 0 \end{bmatrix} \cdot \underline{\underline{X}}(22.5°) \cdot \begin{bmatrix} 1 & 0 \\ 0 & -1 \end{bmatrix} \cdot \underline{\underline{X}}(22.5°) \cdot E_{P,v}(x_{stage}) + \\ \underline{\underline{X}}(-90°) \cdot \begin{bmatrix} 0 & 0 \\ 0 & 1 \end{bmatrix} \cdot \underline{\underline{X}}(22.5°) \cdot \begin{bmatrix} 1 & 0 \\ 0 & -1 \end{bmatrix} \cdot \underline{\underline{X}}(-22.5°) \cdot E_{P,-v}(x_{stage}) \\ \underline{E}_{L,v}(x_{stage}) = \underline{\underline{X}}(-90°) \cdot \begin{bmatrix} 0 & 0 \\ 0 & 1 \end{bmatrix} \cdot \underline{\underline{X}}(22.5°) \cdot \\ \quad \begin{bmatrix} 1 & 0 \\ 0 & -1 \end{bmatrix} \cdot \underline{\underline{X}}(-22.5°) \cdot E_{P,v}(x_{stage}) + \\ \underline{\underline{X}}(90°) \cdot \begin{bmatrix} 1 & 0 \\ 0 & 0 \end{bmatrix} \cdot \underline{\underline{X}}(22.5°) \cdot \begin{bmatrix} 1 & 0 \\ 0 & -1 \end{bmatrix} \cdot \underline{\underline{X}}(-22.5°) \cdot E_{P,-v}(x_{stage}) \end{cases}$$

-continued $$\begin{cases} \underline{E}_{U,v}(x_{stage}) = \frac{1}{\sqrt{2}} \cdot \begin{bmatrix} 0 & 0 \\ 1 & 1 \end{bmatrix} \cdot \underline{E}_{P,v}(x_{stage}) + \frac{1}{\sqrt{2}} \cdot \begin{bmatrix} 1 & -1 \\ 0 & 0 \end{bmatrix} \cdot \underline{E}_{P,-v}(x_{stage}) \\ \underline{E}_{L,v}(x_{stage}) = \frac{1}{\sqrt{2}} \cdot \begin{bmatrix} 1 & -1 \\ 0 & 0 \end{bmatrix} \cdot \underline{E}_{P,v}(x_{stage}) + \frac{1}{\sqrt{2}} \cdot \begin{bmatrix} 0 & 0 \\ 1 & 1 \end{bmatrix} \cdot \underline{E}_{P,-v}(x_{stage}) \end{cases}$$

Note that the indices $v$ and $-v$ are no longer applicable after passing the self-referencing interferometer, and hence have been replaced by U and L. Referring again to FIGS. 5 to 8, the U and L components may be regarded as the +1/−1 and −1/+1 combined components, for the case where $v=1$, and similarly for all $v \in \{-N,N\}$.

Note that it is assumed above that linear x- and y-polarized illumination radiation is being supplied to the target. The rotation of 45° is then effected by half-wave plate 510 at the input side of interferometer 428 (both shown in FIG. 9). If in another example linear 22.5° polarized illumination radiation is used, then the orientation of the half-wave plate is altered to ensure that the radiation that enters the self-referencing interferometer will be linearly polarized at ±45°. (This condition is desirable with the particular interferometer used in these examples, so that both internal "channels" in the self-referencing interferometer are excited evenly.)

Generalizing the above expressions to allow for an arbitrary polarization rotation to be applied by half-wave plate 510 results in:

$$\begin{cases} \underline{E}_{U,v}(x_{stage}) = \underline{\chi}(90°) \cdot \begin{bmatrix} 1 & 0 \\ 0 & 0 \end{bmatrix} \cdot \underline{\chi}(\gamma) \cdot \begin{bmatrix} 1 & 0 \\ 0 & -1 \end{bmatrix} \cdot \underline{\chi}(-\gamma) \cdot \underline{E}_{P,v}(x_{stage}) + \\ \quad \underline{\chi}(-90°) \cdot \begin{bmatrix} 0 & 0 \\ 0 & 1 \end{bmatrix} \cdot \underline{\chi}(\gamma) \cdot \begin{bmatrix} 1 & 0 \\ 0 & -1 \end{bmatrix} \cdot \underline{\chi}(-\gamma) \cdot \underline{E}_{P,-v}(x_{stage}) \\ \underline{E}_{L,v}(x_{stage}) = \underline{\chi}(-90°) \cdot \begin{bmatrix} 0 & 0 \\ 0 & 1 \end{bmatrix} \cdot \underline{\chi}(\gamma) \cdot \begin{bmatrix} 1 & 0 \\ 0 & -1 \end{bmatrix} \cdot \underline{\chi}(-\gamma) \cdot \underline{E}_{P,v}(x_{stage}) + \\ \quad \underline{\chi}(90°) \cdot \begin{bmatrix} 1 & 0 \\ 0 & 0 \end{bmatrix} \cdot \underline{\chi}(\gamma) \cdot \begin{bmatrix} 1 & 0 \\ 0 & -1 \end{bmatrix} \cdot \underline{\chi}(-\gamma) \cdot \underline{E}_{P,-v}(x_{stage}) \end{cases}$$

where $\gamma$ denotes the (counter-clockwise) the half-wave plate 510 (fast axis) located before the self-referencing interferometer. Introducing shorthand matrices $$\underline{\Pi}_{A,\gamma} = \underline{\chi}(90°) \cdot \begin{bmatrix} 1 & 0 \\ 0 & 0 \end{bmatrix} \cdot \underline{\chi}(\gamma) \cdot \begin{bmatrix} 1 & 0 \\ 0 & -1 \end{bmatrix} \cdot \underline{\chi}(-\gamma) \text{ and}$$

$$\underline{\Pi}_{B,\gamma} = \underline{\chi}(90°) \cdot \begin{bmatrix} 0 & 0 \\ 0 & 1 \end{bmatrix} \cdot \underline{\chi}(\gamma) \cdot \begin{bmatrix} 1 & 0 \\ 0 & -1 \end{bmatrix} \cdot \underline{\chi}(-\gamma)$$

the expressions for the detector-level amplitudes can rewritten as:

$$\begin{cases} \underline{E}_{U,v}(x_{stage}) = \underline{\Pi}_{A,\gamma} \cdot \underline{E}_{P,v}(x_{stage}) + \underline{\Pi}_{B,\gamma} \cdot \underline{E}_{P,-v}(x_{stage}) \\ \underline{E}_{L,v}(x_{stage}) = \underline{\Pi}_{B,\gamma} \cdot \underline{E}_{P,v}(x_{stage}) + \underline{\Pi}_{A,\gamma} \cdot \underline{E}_{P,-v}(x_{stage}) \end{cases}$$

Further, by applying the above-defined expression for the complex pupil plane electric field amplitude, as a function of the scan position and by introducing shorthand notation for electric fields $\underline{E}_{A,v} = \underline{\Pi}_{A,\gamma} \cdot \underline{E}_{P,v}(x_{stage}=0)$ and $\underline{E}_{B,v} = \underline{\Pi}_{B,\gamma} \cdot \underline{E}_{P,v}(x_{stage}=0)$, the following expressions can be derived:

$$\begin{cases} \underline{E}_{U,v}(x_{stage}) = \exp\left(\frac{-i \cdot 2 \cdot \pi \cdot v \cdot x_{stage}}{P}\right) \cdot \underline{E}_{A,v} + \\ \quad \exp\left(\frac{i \cdot 2 \cdot \pi \cdot v \cdot x_{stage}}{P}\right) \cdot \underline{E}_{B,-v} \\ \underline{E}_{L,v}(x_{stage}) = \exp\left(\frac{-i \cdot 2 \cdot \pi \cdot v \cdot x_{stage}}{P}\right) \cdot \underline{E}_{B,v} + \\ \quad \exp\left(\frac{i \cdot 2 \cdot \pi \cdot v \cdot x_{stage}}{P}\right) \cdot \underline{E}_{A,-v} \end{cases}$$

Recall from FIG. 9 that, for each color, sum and difference signals are separately carried by the branches A and B. Which branch carries which signal is set for each color by the input polarization. The sum and difference (complex) electric field amplitudes at detector 430A/430B can be computed by propagating the electric fields $\underline{E}_{U,v}(x_{stage})$ and $\underline{E}_{L,v}(x_{stage})$ (after the self-referencing interferometer) in the following order through the half wave plate 514, the polarizing beam splitter 516 and the collector lens assemblies 484A/484B onto the fiber entrance. The result is the following:

$$\begin{cases} \underline{E}_{D,sum,U,v}(x_{stage}) = \begin{bmatrix} 1 & 0 \\ 0 & 0 \end{bmatrix} \cdot \underline{\chi}(22.5°) \cdot \begin{bmatrix} 1 & 0 \\ 0 & -1 \end{bmatrix} \cdot \underline{\chi}(-22.5°) \cdot \underline{E}_{U,v}(x_{stage}) \\ \underline{E}_{D,sum,L,v}(x_{stage}) = \begin{bmatrix} 1 & 0 \\ 0 & 0 \end{bmatrix} \cdot \underline{\chi}(22.5°) \cdot \begin{bmatrix} 1 & 0 \\ 0 & -1 \end{bmatrix} \cdot \underline{\chi}(-22.5°) \cdot \underline{E}_{L,v}(x_{stage}) \\ \underline{E}_{D,diff,U,v}(x_{stage}) = \begin{bmatrix} 0 & 0 \\ 0 & 1 \end{bmatrix} \cdot \underline{\chi}(22.5°) \cdot \begin{bmatrix} 1 & 0 \\ 0 & -1 \end{bmatrix} \cdot \underline{\chi}(-22.5°) \cdot \underline{E}_{U,v}(x_{stage}) \\ \underline{E}_{D,diff,L,v}(x_{stage}) = \begin{bmatrix} 0 & 0 \\ 0 & 1 \end{bmatrix} \cdot \underline{\chi}(22.5°) \cdot \begin{bmatrix} 1 & 0 \\ 0 & -1 \end{bmatrix} \cdot \underline{\chi}(-22.5°) \cdot \underline{E}_{L,v}(x_{stage}) \end{cases}$$

$$\begin{cases} \underline{E}_{D,sum,U,v}(x_{stage}) = \frac{1}{\sqrt{2}} \cdot \begin{bmatrix} 1 & 1 \\ 0 & 0 \end{bmatrix} \cdot \underline{E}_{U,v}(x_{stage}) \\ \underline{E}_{D,sum,L,v}(x_{stage}) = \frac{1}{\sqrt{2}} \cdot \begin{bmatrix} 1 & 1 \\ 0 & 0 \end{bmatrix} \cdot \underline{E}_{L,v}(x_{stage}) \\ \underline{E}_{D,diff,U,v}(x_{stage}) = \frac{1}{\sqrt{2}} \cdot \begin{bmatrix} 0 & 0 \\ 1 & -1 \end{bmatrix} \cdot \underline{E}_{U,v}(x_{stage}) \\ \underline{E}_{D,diff,L,v}(x_{stage}) = \frac{1}{\sqrt{2}} \cdot \begin{bmatrix} 0 & 0 \\ 1 & -1 \end{bmatrix} \cdot \underline{E}_{L,v}(x_{stage}) \end{cases}$$

The sum and difference (alignment) detector intensities can now be computed by summing the contributions from the different diffraction orders as shown in the following equations:

$$\begin{cases} I_{D,sum}(x_{stage}) = \sum_{\substack{v=-N \\ v \neq 0}}^{N} \langle \underline{E}_{D,sum,v}(x_{stage}), \underline{E}_{D,sum,v}(x_{stage}) \rangle \\ I_{D,diff}(x_{stage}) = \sum_{\substack{v=-N \\ v \neq 0}}^{N} \langle \underline{E}_{D,diff,v}(x_{stage}), \underline{E}_{D,diff,v}(x_{stage}) \rangle \end{cases}$$

-continued $$\begin{cases} I_{D,sum}(x_{stage}) = \sum_{\substack{v=-N \\ v \neq 0}}^{N} \langle E_{D,sum,U,v}(x_{stage}), E_{D,sum,U,v}(x_{stage}) \rangle + \\ \qquad \sum_{\substack{v=-N \\ v \neq 0}}^{N} \langle E_{D,sum,L,v}(x_{stage}), E_{D,sum,L,v}(x_{stage}) \rangle \\ I_{D,diff}(x_{stage}) = \sum_{\substack{v=-N \\ v \neq 0}}^{N} \langle E_{D,diff,U,v}(x_{stage}), E_{D,diff,U,v}(x_{stage}) \rangle + \\ \qquad \sum_{\substack{v=-N \\ v \neq 0}}^{N} \langle E_{D,diff,L,v}(x_{stage}), E_{D,diff,L,v}(x_{stage}) \rangle \end{cases}$$

$$\begin{cases} I_{D,sum}(x_{stage}) = \sum_{\substack{v=-N \\ v \neq 0}}^{N} E_{D,sum,U,v}^{H}(x_{stage}) \cdot E_{D,sum,U,v}(x_{stage}) + \\ \qquad E_{D,sum,L,v}^{H}(x_{stage}) \cdot E_{D,sum,L,v}(x_{stage}) \\ I_{D,diff}(x_{stage}) = \sum_{\substack{v=-N \\ v \neq 0}}^{N} E_{D,diff,U,v}^{H}(x_{stage}) \cdot E_{D,diff,U,v}(x_{stage}) + \\ \qquad E_{D,diff,L,v}^{H}(x_{stage}) \cdot E_{D,diff,L,v}(x_{stage}) \end{cases}$$

which can be expanded to $$I_{D,sum}(x_{stage}) = \sum_{\substack{v=-N \\ v \neq 0}}^{N} \left( \begin{array}{l} \left( \begin{array}{l} \exp\left(\frac{i \cdot 2 \cdot \pi \cdot v \cdot x_{stage}}{P}\right) \cdot E_{A,v}^{H} + \\ \exp\left(\frac{i \cdot 2 \cdot \pi \cdot v \cdot x_{stage}}{P}\right) \cdot E_{B,-v}^{H} \end{array} \right) \frac{1}{2} \cdot \begin{bmatrix} 1 & 1 \\ 1 & 1 \end{bmatrix} \cdot \\ \left( \begin{array}{l} \exp\left(\frac{i \cdot 2 \cdot \pi \cdot v \cdot x_{stage}}{P}\right) \cdot E_{A,v}^{H} + \\ \exp\left(\frac{i \cdot 2 \cdot \pi \cdot v \cdot x_{stage}}{P}\right) \cdot E_{B,-v}^{H} \end{array} \right) \\ + \\ \left( \begin{array}{l} \exp\left(\frac{i \cdot 2 \cdot \pi \cdot v \cdot x_{stage}}{P}\right) \cdot E_{B,v}^{H} + \\ \exp\left(\frac{-i \cdot 2 \cdot \pi \cdot v \cdot x_{stage}}{P}\right) \cdot E_{A,-v}^{H} \end{array} \right) \frac{1}{2} \cdot \begin{bmatrix} 1 & 1 \\ 1 & 1 \end{bmatrix} \cdot \\ \left( \begin{array}{l} \exp\left(\frac{-i \cdot 2 \cdot \pi \cdot v \cdot x_{stage}}{P}\right) \cdot E_{B,v} + \\ \exp\left(\frac{i \cdot 2 \cdot \pi \cdot v \cdot x_{stage}}{P}\right) \cdot E_{A,-v} \end{array} \right) \end{array} \right)$$

$$I_{D,diff}(x_{stage}) = \sum_{\substack{v=-N \\ v \neq 0}}^{N} \left( \begin{array}{l} \left( \begin{array}{l} \exp\left(\frac{i \cdot 2 \cdot \pi \cdot v \cdot x_{stage}}{P}\right) \cdot E_{A,v}^{H} + \\ \exp\left(\frac{-i \cdot 2 \cdot \pi \cdot v \cdot x_{stage}}{P}\right) \cdot E_{B,-v}^{H} \end{array} \right) \frac{1}{2} \cdot \begin{bmatrix} 1 & -1 \\ -1 & 1 \end{bmatrix} \cdot \\ \left( \begin{array}{l} \exp\left(\frac{-i \cdot 2 \cdot \pi \cdot v \cdot x_{stage}}{P}\right) \cdot E_{A,v} + \\ \exp\left(\frac{i \cdot 2 \cdot \pi \cdot v \cdot x_{stage}}{P}\right) \cdot E_{B,-v} \end{array} \right) \\ + \\ \left( \begin{array}{l} \exp\left(\frac{i \cdot 2 \cdot \pi \cdot v \cdot x_{stage}}{P}\right) \cdot E_{B,v}^{H} + \\ \exp\left(\frac{-i \cdot 2 \cdot \pi \cdot v \cdot x_{stage}}{P}\right) \cdot E_{A,-v}^{H} \end{array} \right) \frac{1}{2} \cdot \begin{bmatrix} 1 & -1 \\ -1 & 1 \end{bmatrix} \cdot \\ \left( \begin{array}{l} \exp\left(\frac{-i \cdot 2 \cdot \pi \cdot v \cdot x_{stage}}{P}\right) \cdot E_{B,v} + \\ \exp\left(\frac{i \cdot 2 \cdot \pi \cdot v \cdot x_{stage}}{P}\right) \cdot E_{A,-v} \end{array} \right) \end{array} \right)$$

Whichever form of expression is used, it will be seen that each of these intensity values, corresponding to the position-varying waveform recorded as the spot 202 scans a target, is the summation of N different orders, corresponding to the diffraction orders v. Within each order v, there are two constant terms, representing a DC component, and a periodic term with spatial frequency $4\pi v$ f P. Comparing the sum and difference signals, it can be seen that they are identical except that their periodic components are in antiphase. Note that it is assumed that the zeroth diffraction order (i.e. the reflected order with v=0) is blocked somewhere along the path from objective 424 to the interferometer, as already described above. It is further assumed that the detector surface is large relative to the pitch of the target grating. This means that the electric field amplitudes at the detector surface, resulting from pairs of two plane waves incident on the detector surface, are all orthogonal on the interval defined by the detector surface area. Hence these electric field amplitudes at the detector surfaces, due to the different order pairs, may be summed incoherently, as has been done.

Referring to steps S42-S43 of the method in FIG. 11, which incidentally can share processing with step S2 in FIG. 10, the estimation of the (relative) alignment position from the alignment sensor detector intensity signal(s) $I_{D,sum}$ ($x_{stage}$)) and/or $I_{D,diff}$ ($x_{stage}$) is now discussed. From the above result one can observe that for a symmetrical grating, in which the (complex) electric field amplitudes $\underline{E}_{P,v}$ and $\underline{E}_{P,-v}$ are equal, the maximum of the alignment sensor detector intensity sum signal $I_{D,sum}(x_{stage})$) is located at $x_{stage}=0$. For the alignment sensor detector intensity difference signal $I_{D,diff}$ ($x_{stage}$) a minimum is located at $x_{stage}=0$. The alignment position estimation is based upon this property. Clearly the zero (reference) position for this purpose is centered on some defined part of the mark, and will itself have a certain position relative to a coordinate system of, for example, the substrate as a whole. Later a refinement is described allowing the reference position to be defined in a flexible way to suit the application, and to allow for the fact that the mark itself may be distorted and its reference position is not straightforward to define.

Given for example the position-dependent sum intensity signal $I_{D,sum}(x_{stage})$ received from alignment sensor detector, one can estimate the (relative) phase of the term $$2 \cdot \text{Re}\left( \exp\left(\frac{-i \cdot 4 \cdot \pi \cdot v \cdot x_{stage}}{P}\right) \cdot \left( E_{B,-v}^{H} \cdot \frac{1}{2} \cdot \begin{bmatrix} 1 & 1 \\ 1 & 1 \end{bmatrix} \cdot \underline{E}_{A,v} + E_{A,-v}^{H} \cdot \frac{1}{2} \cdot \begin{bmatrix} 1 & 1 \\ 1 & 1 \end{bmatrix} \cdot \underline{E}_{B,v} \right) \right)$$

using for example a projection or a fit approach. Using this projection or fit approach, the alignment sensor detector intensity signal (for each color) is decomposed by the processing unit PU using for example a Fourier transform as follows:

$$u_0 + \sum_{v=1}^{N} u_{v,cos} \cdot \cos\left(\frac{4 \cdot \pi \cdot v \cdot x_{stage}}{P}\right) + u_{v,sin} \cdot \sin\left(\frac{4 \cdot \pi \cdot v \cdot x_{stage}}{P}\right) \approx I_D(x_{stage}).$$

In this equation $u_0$ is a zero order (DC) coefficient, while $u_v$ is generally a vth order Fourier coefficient. For each order there is a cosine coefficient $u_{v,cos}$ and a sine coefficient $u_{v,sin}$. The relationship between these two corresponds to the phase of the periodic component of that order. In physical terms, each value of v corresponding to a diffraction order in the diffraction spectrum of the target grating gives rise directly to a corresponding order (harmonic component) in the position-dependent detector waveform I (x). Based on the above decomposition (step S42) there are computed a phase $\phi_v$ for each order and consequently (step S43) a (relative) alignment position $x_{align,v}$ using the formulae:

$$\begin{cases} \varphi_v = \text{atan2}(u_{v,sin}, u_{v,cos}) \\ x_{align,v} = \frac{-P}{4 \cdot \pi \cdot v} \cdot \varphi_v \end{cases}.$$

So it can be seen that one computes (or at least can compute) multiple (relative) alignment positions from each waveform, one for each positive value of $v$, i.e. $v \in \{1, \ldots, N\}$. Note that in case of rigorous modeling of the alignment mark (as opposed to a strictly Fourier optics model), (relative) alignment positions can be estimated for even orders, i.e. $v \in \{2, 4, \ldots\}$, as the (complex) electric field amplitudes $\underline{E}_{P,v}$ and $\underline{E}_{P,-v}$ are (in general) non-zero for these even orders. Also, when asymmetry occurs in the alignment mark, the complex electric field amplitudes are (in general) non-zero for these even orders, and the even orders may carry particular information about asymmetry. Note that one can derive the phase and hence the alignment position equally using either the sum signal $I_{D,sum}(x_{stage})$ or the difference signal $I_{D,diff}(x_{stage})$, provided one takes account of the minus sign in front of the periodic component. One can also use both sum and difference signals in combination. Using both signals can improve signal to noise ratios, as they use different sets of photons and therefore their noise components (or at least those due for example to photon shot noise and detector noise) should be uncorrelated.

Referring to step S44, the influence on the estimated alignment position of photon Poisson noise at the level of the alignment sensor detectors 430A, 430B is now discussed. This noise estimation allows the best signals to be selected for use in calculating the position measurement. In order to compute the noise sensitivity of the estimated alignment position for a given color, order etc., the following derivatives are computed:

$$\begin{cases} \frac{\partial x_{align,v}}{\partial u_{v,cos}} = \frac{\partial}{\partial u_{v,cos}} \cdot \frac{-P}{4 \cdot \pi \cdot v} \cdot \text{atan2}(u_{v,sin}, u_{v,cos}) \\ \frac{\partial x_{align,v}}{\partial u_{v,sin}} = \frac{\partial}{\partial u_{v,sin}} \cdot \frac{-P}{4 \cdot \pi \cdot v} \cdot \text{atan2}(u_{v,sin}, u_{v,cos}) \end{cases}$$

$$\begin{cases} \frac{\partial x_{align,v}}{\partial u_{v,cos}} = \frac{-P}{4 \cdot \pi \cdot v} \cdot \frac{-u_{v,sin}}{u_{v,cos}^2 + u_{v,sin}^2} \\ \frac{\partial x_{align,v}}{\partial u_{v,cos}} = \frac{-P}{4 \cdot \pi \cdot v} \cdot \frac{-u_{v,sin}}{u_{v,cos}^2 + u_{v,sin}^2} \end{cases}.$$

It is assumed that the total number of photons at detector level within a detector integration time interval is (very) large, so that the Poisson distribution (which describes the number of photons arriving at the detector) is approximated well by the normal (i.e. Gaussian) distribution. It is also assumed that the noise is white noise. Note that if a discrete Fourier transform is made of a white noise signal, then all spectral components will have an expected value that equals zero, and will have an identical variance. As the periodic components $$\cos\left(\frac{4 \cdot \pi \cdot v \cdot x_{stage}}{P}\right) \text{ and } \sin\left(\frac{4 \cdot \pi \cdot v \cdot x_{stage}}{P}\right)$$

will be mutually orthogonal on the scan trajectory interval, it can be concluded that $\text{cov}(u_{v,cos}, u_{v,sin}) = 0$. Hence the following result can be derived:

$$\sigma_{x_{align,v}}^2 = \frac{\partial x_{align,v}}{\partial u_{v,cos}} \cdot \sigma_{u_{v,cos}}^2 \cdot \frac{\partial x_{align,v}}{\partial u_{v,cos}} + \frac{\partial x_{align,v}}{\partial u_{v,sin}} \cdot \sigma_{u_{v,sin}}^2 \cdot \frac{\partial x_{align,v}}{\partial u_{v,sin}}$$

$$= \left(\frac{-P}{4 \cdot \pi \cdot v} \cdot \frac{-u_{v,sin}}{u_{v,cos}^2 + u_{v,sin}^2}\right)^2 \cdot \sigma_{u_{v,cos}}^2 +$$

$$\left(\frac{-P}{4 \cdot \pi \cdot v} \cdot \frac{u_{v,cos}}{u_{v,cos}^2 + u_{v,sin}^2}\right)^2 \cdot \sigma_{u_{v,sin}}^2$$

$$= \left(\frac{P}{4 \cdot \pi \cdot v} \cdot \frac{u_{v,sin}}{u_{v,cos}^2 + u_{v,sin}^2}\right)^2 \cdot \sigma_{u_{v,cos}}^2 +$$

$$\left(\frac{P}{4 \cdot \pi \cdot v} \cdot \frac{u_{v,cos}}{u_{v,cos}^2 + u_{v,sin}^2}\right)^2 \cdot \sigma_{u_{v,sin}}^2$$

$$= \left(\frac{P}{4 \cdot \pi \cdot v} \cdot \frac{1}{u_{v,cos}^2 + u_{v,sin}^2}\right)^2 \cdot \left(u_{v,sin}^2 \cdot \sigma_{u_{v,cos}}^2 + u_{v,cos}^2 \cdot \sigma_{u_{v,sin}}^2\right).$$

In order to simplify the computation of $\sigma_{u_{v,cos}}^2$ and $\sigma_{u_{v,sin}}^2$ it is assumed that the asymmetry of the target is sufficiently small, so that it can be neglected. Further, it is assumed that the alignment target is positioned such that it is symmetrical around $x_{stage} = 0$. In this particular case the following identities will hold $\underline{E}_{A,v} = \underline{E}_{A,-v}$ and $\underline{E}_{B,v} = \underline{E}_{B,-v}$.

From the derivation presented earlier, the sum alignment detector intensity can be derived as follows (simplified according to those simplifying assumptions):

$$I_{D,sum}(x_{stage}) = \sum_{\substack{v=-N \\ v \neq 0}}^{N} \begin{pmatrix} \underline{E}_{A,v}^H \cdot \frac{1}{2} \cdot \begin{bmatrix} 1 & 1 \\ 1 & 1 \end{bmatrix} \cdot \underline{E}_{A,v} + \underline{E}_{B,-v}^H \cdot \frac{1}{2} \cdot \begin{bmatrix} 1 & 1 \\ 1 & 1 \end{bmatrix} \cdot \underline{E}_{B,-v} + \\ \underline{E}_{B,v}^H \cdot \frac{1}{2} \cdot \begin{bmatrix} 1 & 1 \\ 1 & 1 \end{bmatrix} \cdot \underline{E}_{B,v} + \underline{E}_{A,-v}^H \cdot \frac{1}{2} \cdot \begin{bmatrix} 1 & 1 \\ 1 & 1 \end{bmatrix} \cdot \underline{E}_{A,-v} + \\ 2 \cdot \text{Re}\left(\exp\left(\frac{-i \cdot 4 \cdot \pi \cdot v \cdot x_{stage}}{P}\right) \cdot \right. \\ \left. \left(\underline{E}_{B,-v}^H \cdot \frac{1}{2} \cdot \begin{bmatrix} 1 & 1 \\ 1 & 1 \end{bmatrix} \cdot \underline{E}_{A,v} + \underline{E}_{A,-v}^H \cdot \frac{1}{2} \cdot \begin{bmatrix} 1 & 1 \\ 1 & 1 \end{bmatrix} \cdot \underline{E}_{B,v}\right)\right) \end{pmatrix}$$

$$= \sum_{\substack{v=-N \\ v \neq 0}}^{N} \begin{pmatrix} \underline{E}_{A,v}^H \cdot \frac{1}{2} \cdot \begin{bmatrix} 1 & 1 \\ 1 & 1 \end{bmatrix} \cdot \underline{E}_{A,v} + \underline{E}_{B,v}^H \cdot \frac{1}{2} \cdot \begin{bmatrix} 1 & 1 \\ 1 & 1 \end{bmatrix} \cdot \underline{E}_{B,v} + \\ \underline{E}_{B,v}^H \cdot \frac{1}{2} \cdot \begin{bmatrix} 1 & 1 \\ 1 & 1 \end{bmatrix} \cdot \underline{E}_{B,v} + \underline{E}_{A,v}^H \cdot \frac{1}{2} \cdot \begin{bmatrix} 1 & 1 \\ 1 & 1 \end{bmatrix} \cdot \underline{E}_{A,v} + \\ 2 \cdot \text{Re}\left(\exp\left(\frac{-i \cdot 4 \cdot \pi \cdot v \cdot x_{stage}}{P}\right) \cdot \right. \\ \left. \left(\underline{E}_{B,v}^H \cdot \frac{1}{2} \cdot \begin{bmatrix} 1 & 1 \\ 1 & 1 \end{bmatrix} \cdot \underline{E}_{A,v} + \underline{E}_{A,v}^H \cdot \frac{1}{2} \cdot \begin{bmatrix} 1 & 1 \\ 1 & 1 \end{bmatrix} \cdot \underline{E}_{B,v}\right)\right) \end{pmatrix}$$

$$= \sum_{\substack{v=-N \\ v \neq 0}}^{N} \begin{pmatrix} 2 \cdot \underline{E}_{A,v}^H \cdot \frac{1}{2} \cdot \begin{bmatrix} 1 & 1 \\ 1 & 1 \end{bmatrix} \cdot \underline{E}_{A,v} + \\ 2 \cdot \underline{E}_{B,v}^H \cdot \frac{1}{2} \cdot \begin{bmatrix} 1 & 1 \\ 1 & 1 \end{bmatrix} \cdot \underline{E}_{B,v} + \\ 4 \cdot \text{Re}\left(\exp\left(\frac{-i \cdot 4 \cdot \pi \cdot v \cdot x_{stage}}{P}\right) \cdot \right. \\ \left. \left(\underline{E}_{B,v}^H \cdot \frac{1}{2} \cdot \begin{bmatrix} 1 & 1 \\ 1 & 1 \end{bmatrix} \cdot \underline{E}_{A,v}\right)\right) \end{pmatrix}.$$

Note that one could equally start with the different detector intensity signal. It turns out that the conclusion as to the variance $\sigma_{x_{align}}^2$ is unaffected, so just the sum detector as the example is considered here.

A detector gain scaling constant G can be defined as follows:

$$G = \sqrt{\frac{I_D}{N}}$$

$$N = \frac{I_D}{G^2}.$$

where N denotes a number of photon-electrons, by which it meant the proportion of photons that are converted into electrons so as to give rise to a signal in the detector. As the photon-electron arrival is a Poisson process, the instantaneous variance of the detector signal equals the number of instantaneous photoelectrons at the detector. This property allows computations of the variance $\sigma_{I_{D,sum}}^2(x_{stage})$ of $I_{D,sum}(x_{stage})$ as follows:

$$I_{D,sum}(x_{stage}) = \sum_{\substack{v=-N \\ v \neq 0}}^{N} \begin{pmatrix} 2 \cdot E_{A,v}^H \cdot \frac{1}{2} \cdot \begin{bmatrix} 1 & 1 \\ 1 & 1 \end{bmatrix} \cdot E_{A,v} + \\ 2 \cdot E_{B,v}^H \cdot \frac{1}{2} \cdot \begin{bmatrix} 1 & 1 \\ 1 & 1 \end{bmatrix} \cdot E_{B,v} + \\ 4 \cdot \text{Re}\left(\exp\left(\frac{-i \cdot 4 \cdot \pi \cdot v \cdot x_{stage}}{P}\right) \cdot \right. \\ \left. \left(E_{B,v}^H \cdot \frac{1}{2} \cdot \begin{bmatrix} 1 & 1 \\ 1 & 1 \end{bmatrix} \cdot E_{A,v}\right)\right) \end{pmatrix}$$

$$N_{D,sum}(x_{stage}) = \frac{1}{G^2} \cdot I_{D,sum}(x_{stage})$$

$$\sigma_{N_{D,sum}}^2(x_{stage}) = \frac{1}{G^2} \cdot I_{D,sum}(x_{stage})$$

$$\sigma_{I_{D,sum}}^2(x_{stage}) = G^2 \cdot I_{D,sum}(x_{stage}).$$

Recalling the following expression:

$$u_0 + \sum_{v=1}^{N} u_{v,cos} \cdot \cos\left(\frac{4 \cdot \pi \cdot v \cdot x_{stage}}{P}\right) + u_{v,sin} \cdot \sin\left(\frac{4 \cdot \pi \cdot v \cdot x_{stage}}{P}\right) \approx I_D(x_{stage})$$

and combining it with this one:

$$I_{D,sum}(x_{stage}) = \sum_{\substack{v=-N \\ v \neq 0}}^{N} \begin{pmatrix} E_{A,v}^H \cdot \frac{1}{2} \cdot \begin{bmatrix} 1 & 1 \\ 1 & 1 \end{bmatrix} \cdot E_{A,v} + E_{B,-v}^H \cdot \frac{1}{2} \cdot \begin{bmatrix} 1 & 1 \\ 1 & 1 \end{bmatrix} \cdot E_{B,-v} + \\ E_{B,v}^H \cdot \frac{1}{2} \cdot \begin{bmatrix} 1 & 1 \\ 1 & 1 \end{bmatrix} \cdot E_{B,v} + E_{A,-v}^H \cdot \frac{1}{2} \cdot \begin{bmatrix} 1 & 1 \\ 1 & 1 \end{bmatrix} \cdot E_{A,-v} + \\ 2 \cdot \text{Re}\left(\exp\left(\frac{-i \cdot 4 \cdot \pi \cdot v \cdot x_{stage}}{P}\right) \cdot \right. \\ \left. \left(E_{B,-v}^H \cdot \frac{1}{2} \cdot \begin{bmatrix} 1 & 1 \\ 1 & 1 \end{bmatrix} \cdot E_{A,v} + E_{A,-v}^H \cdot \frac{1}{2} \cdot \begin{bmatrix} 1 & 1 \\ 1 & 1 \end{bmatrix} \cdot E_{B,v}\right)\right) \end{pmatrix}$$

it can be observed that the following two identities hold (in general):

$$u_0 \approx \sum_{\substack{v=-N \\ v \neq 0}}^{N} \left(E_{A,v}^H \cdot \frac{1}{2} \cdot \begin{bmatrix} 1 & 1 \\ 1 & 1 \end{bmatrix} \cdot E_{A,v} + E_{B,-v}^H \cdot \frac{1}{2} \cdot \begin{bmatrix} 1 & 1 \\ 1 & 1 \end{bmatrix} \cdot E_{B,-v} + \right.$$

$$\left. E_{B,v}^H \cdot \frac{1}{2} \cdot \begin{bmatrix} 1 & 1 \\ 1 & 1 \end{bmatrix} \cdot E_{B,v} + E_{A,-v}^H \cdot \frac{1}{2} \cdot \begin{bmatrix} 1 & 1 \\ 1 & 1 \end{bmatrix} \cdot E_{A,-v}\right)$$

and $$\sqrt{u_{v,cos}^2 + u_{v,sin}^2} \approx 2 \cdot \left| E_{B,-v}^H \cdot \frac{1}{2} \cdot \begin{bmatrix} 1 & 1 \\ 1 & 1 \end{bmatrix} \cdot E_{A,v} + E_{A,-v}^H \cdot \frac{1}{2} \cdot \begin{bmatrix} 1 & 1 \\ 1 & 1 \end{bmatrix} \cdot E_{B,v} \right|.$$

Hence $U_0$ and $\sqrt{u_{v,cos}^2 + u_{v,sin}^2}$ can be used an estimator for the intensity when actually measuring signals. If the above two identities are simplified for the particular case described above (i.e. where hold and) then it yields:

$$u_0 \approx 2 \cdot \sum_{\substack{v=-N \\ v \neq 0}}^{N} \left(E_{A,v}^H \cdot \frac{1}{2} \cdot \begin{bmatrix} 1 & 1 \\ 1 & 1 \end{bmatrix} \cdot E_{A,v} + E_{B,v}^H \cdot \frac{1}{2} \cdot \begin{bmatrix} 1 & 1 \\ 1 & 1 \end{bmatrix} \cdot E_{B,v}\right)$$

and $$\sqrt{u_{v,cos}^2 + u_{v,sin}^2} \approx 4 \cdot \left| E_{B,v}^H \cdot \frac{1}{2} \cdot \begin{bmatrix} 1 & 1 \\ 1 & 1 \end{bmatrix} \cdot E_{A,v} \right|.$$

For later use, there is introduced a convenient shorthand notation for the maximum number of photoelectrons in the sum detector intensity signal as:

$$N_{max} = \max(N_{D,sum}(x_{stage}))$$

$$= \frac{1}{G^2} \cdot 4 \cdot \sum_{\substack{v'=-N \\ v' \neq 0}}^{N} \left(E_{A,v'}^H \cdot \frac{1}{2} \cdot \begin{bmatrix} 1 & 1 \\ 1 & 1 \end{bmatrix} \cdot E_{A,v'} + E_{B,v'}^H \cdot \frac{1}{2} \cdot \begin{bmatrix} 1 & 1 \\ 1 & 1 \end{bmatrix} \cdot E_{B,v'}\right).$$

The variances $\sigma_{u_{v,cos}}^2$ and $\sigma_{u_{v,sin}}^2$ can now be computed by summing the instantaneous variances of the alignment detector signal over one full period of the alignment signal, and taking energy conservation into account. The calculation goes as follows:

$$\begin{cases} \sigma_{u_{v,sin}}^2 = \dfrac{\int_0^{\frac{P}{2v}} \sigma_{I_{D,sum}}^2(x_{stage}) \cdot \left|\sin\left(\frac{4 \cdot \pi \cdot v \cdot x_{stage}}{P}\right)\right| \cdot dx_{stage}}{\int_0^{\frac{P}{2v}} \left(\left|\sin\left(\frac{4 \cdot \pi \cdot v \cdot x_{stage}}{P}\right)\right| + \left|\cos\left(\frac{4 \cdot \pi \cdot v \cdot x_{stage}}{P}\right)\right|\right) \cdot dx_{stage}} \\ \sigma_{u_{v,cos}}^2 = \dfrac{\int_0^{\frac{P}{2v}} \sigma_{I_{D,sum}}^2(x_{stage}) \cdot \left|\cos\left(\frac{4 \cdot \pi \cdot v \cdot x_{stage}}{P}\right)\right| \cdot dx_{stage}}{\int_0^{\frac{P}{2v}} \left(\left|\sin\left(\frac{4 \cdot \pi \cdot v \cdot x_{stage}}{P}\right)\right| + \left|\cos\left(\frac{4 \cdot \pi \cdot v \cdot x_{stage}}{P}\right)\right|\right) \cdot dx_{stage}} \end{cases}$$

-continued $$\begin{cases} \sigma^2_{u_{v,sin}} = \dfrac{\int_0^{\frac{P}{2\cdot v}} G^2 \cdot I_{D,sum}(x_{stage}) \cdot \left|\sin\left(\dfrac{4\cdot \pi \cdot v \cdot x_{stage}}{P}\right)\right| \cdot dx_{stage}}{\int_0^{\frac{P}{2\cdot v}} \left(\left|\sin\left(\dfrac{4\cdot \pi \cdot v \cdot x_{stage}}{P}\right)\right| + \left|\cos\left(\dfrac{4\cdot \pi \cdot v \cdot x_{stage}}{P}\right)\right|\right) \cdot dx_{stage}} \\[2em] \sigma^2_{u_{v,cos}} = \dfrac{\int_0^{\frac{P}{2\cdot v}} G^2 \cdot I_{D,sum}(x_{stage}) \cdot \left|\cos\left(\dfrac{4\cdot \pi \cdot v \cdot x_{stage}}{P}\right)\right| \cdot dx_{stage}}{\int_0^{\frac{P}{2\cdot v}} \left(\left|\sin\left(\dfrac{4\cdot \pi \cdot v \cdot x_{stage}}{P}\right)\right| + \left|\cos\left(\dfrac{4\cdot \pi \cdot v \cdot x_{stage}}{P}\right)\right|\right) \cdot dx_{stage}} \end{cases}$$

$$\begin{cases} \sigma^2_{u_{v,sin}} = G^2 \cdot \dfrac{\pi \cdot v}{2\cdot P} \cdot \int_0^{\frac{P}{2\cdot v}} I_{D,sum}(x_{stage}) \cdot \left|\sin\left(\dfrac{4\cdot \pi \cdot v \cdot x_{stage}}{P}\right)\right| \cdot dx_{stage} \\[1em] \sigma^2_{u_{v,cos}} = G^2 \cdot \dfrac{\pi \cdot v}{2\cdot P} \cdot \int_0^{\frac{P}{2\cdot v}} I_{D,sum}(x_{stage}) \cdot \left|\cos\left(\dfrac{4\cdot \pi \cdot v \cdot x_{stage}}{P}\right)\right| \cdot dx_{stage} \end{cases}$$

The above two integrals can be evaluated indirectly by means of numerical Monte Carlo computations, to compute the variance $\sigma_{x,align,v}^2$ directly for the generic case. The principles and practice of such calculations are well known for the skilled reader. Broadly speaking, one makes copies of the alignment signal $I_{D,sum}(x_{stage})$, and adds noise to each copy. Next, for each noisy alignment signal, an alignment position is computed, and finally the variance of the alignment position can be computed.

As an alternative to the numerical solution, it may be useful to have an analytical "rule of thumb" expressing the relationship between the number of photons and the variance of the estimated, relative alignment position. To obtain this rule of thumb, it is also assumed that the alignment signal consists of first order diffraction information only. In this particular case, the above integrals can be simplified into:

$$\begin{cases} \sigma^2_{u_{v=1,sin}} = \dfrac{\int_0^{\frac{P}{2}} G^2 \cdot I_{D,sum}(x_{stage}) \cdot \left|\sin\left(\dfrac{4\cdot \pi \cdot x_{stage}}{P}\right)\right| \cdot dx_{stage}}{\int_0^{\frac{P}{2}} \left(\left|\sin\left(\dfrac{4\cdot \pi \cdot x_{stage}}{P}\right)\right| + \left|\cos\left(\dfrac{4\cdot \pi \cdot x_{stage}}{P}\right)\right|\right) \cdot dx_{stage}} \\[2em] \sigma^2_{u_{v=1,cos}} = \dfrac{\int_0^{\frac{P}{2}} G^2 \cdot I_{D,sum}(x_{stage}) \cdot \left|\cos\left(\dfrac{4\cdot \pi \cdot x_{stage}}{P}\right)\right| \cdot dx_{stage}}{\int_0^{\frac{P}{2}} \left(\left|\sin\left(\dfrac{4\cdot \pi \cdot x_{stage}}{P}\right)\right| + \left|\cos\left(\dfrac{4\cdot \pi \cdot x_{stage}}{P}\right)\right|\right) \cdot dx_{stage}} \end{cases}$$

$$\begin{cases} \sigma^2_{u_{v=1,sin}} = \dfrac{\int_0^{\frac{P}{2}} G^2 \cdot \sum\limits_{\substack{v'=-1 \\ v'\neq 0}}^{1} \left( \begin{array}{l} 2\cdot E_{A,v'}^H \cdot \dfrac{1}{2} \cdot \begin{bmatrix} 1 & 1 \\ 1 & 1 \end{bmatrix} \cdot E_{A,v'} + 2\cdot E_{B,v'}^H \cdot \dfrac{1}{2} \cdot \begin{bmatrix} 1 & 1 \\ 1 & 1 \end{bmatrix} \cdot E_{B,v'} + \\ 4\cdot \mathrm{Re}\!\left(\exp\!\left(\dfrac{-i\cdot 4\cdot \pi \cdot v' \cdot x_{stage}}{P}\right) \cdot \left(E_{B,v'}^H \cdot \dfrac{1}{2} \cdot \begin{bmatrix} 1 & 1 \\ 1 & 1 \end{bmatrix} \cdot E_{A,v'}\right)\right) \end{array} \right) \cdot \left|\sin\!\left(\dfrac{4\cdot \pi \cdot x_{stage}}{P}\right)\right| \cdot dx_{stage}}{\int_0^{\frac{P}{2}} \left(\left|\sin\!\left(\dfrac{4\cdot \pi \cdot x_{stage}}{P}\right)\right| + \left|\cos\!\left(\dfrac{4\cdot \pi \cdot x_{stage}}{P}\right)\right|\right) \cdot dx_{stage}} \\[3em] \sigma^2_{u_{v=1,cos}} = \dfrac{\int_0^{\frac{P}{2}} G^2 \cdot \sum\limits_{\substack{v'=-1 \\ v'\neq 0}}^{1} \left( \begin{array}{l} 2\cdot E_{A,v'}^H \cdot \dfrac{1}{2} \cdot \begin{bmatrix} 1 & 1 \\ 1 & 1 \end{bmatrix} \cdot E_{A,v'} + 2\cdot E_{B,v'}^H \cdot \dfrac{1}{2} \cdot \begin{bmatrix} 1 & 1 \\ 1 & 1 \end{bmatrix} \cdot E_{B,v'} + \\ 4\cdot \mathrm{Re}\!\left(\left(E_{B,v'}^H \cdot \dfrac{1}{2} \cdot \begin{bmatrix} 1 & 1 \\ 1 & 1 \end{bmatrix} \cdot E_{A,v'}\right)\right) \end{array} \right) \cdot \left|\cos\!\left(\dfrac{4\cdot \pi \cdot x_{stage}}{P}\right)\right| \cdot dx_{stage}}{\int_0^{\frac{P}{2}} \left(\left|\sin\!\left(\dfrac{4\cdot \pi \cdot x_{stage}}{P}\right)\right| + \left|\cos\!\left(\dfrac{4\cdot \pi \cdot x_{stage}}{P}\right)\right|\right) \cdot dx_{stage}} \end{cases}$$

$$\begin{cases} G^2 \cdot \sum_{\substack{v'=-1 \\ v' \neq 0}}^{1} \left(2 \cdot E_{A,v'}^H \cdot \frac{1}{2} \cdot \begin{bmatrix} 1 & 1 \\ 1 & 1 \end{bmatrix} \cdot E_{A,v'} + 2 \cdot E_{B,v'}^H \cdot \frac{1}{2} \cdot \begin{bmatrix} 1 & 1 \\ 1 & 1 \end{bmatrix} \cdot E_{B,v'}\right) \cdot \\ \sigma_{u_{v=1,sin}}^2 = \frac{\int_0^{\frac{P}{2}} \left|\sin\left(\frac{4 \cdot \pi \cdot x_{stage}}{P}\right)\right| \cdot dx_{stage}}{\int_0^{\frac{P}{2}} \left(\left|\sin\left(\frac{4 \cdot \pi \cdot x_{stage}}{P}\right)\right| + \left|\cos\left(\frac{4 \cdot \pi \cdot x_{stage}}{P}\right)\right|\right) \cdot dx_{stage}} \\[1em] G^2 \cdot \sum_{\substack{v'=-1 \\ v' \neq 0}}^{1} \left(2 \cdot E_{A,v'}^H \cdot \frac{1}{2} \cdot \begin{bmatrix} 1 & 1 \\ 1 & 1 \end{bmatrix} \cdot E_{A,v'} + 2 \cdot E_{B,v'}^H \cdot \frac{1}{2} \cdot \begin{bmatrix} 1 & 1 \\ 1 & 1 \end{bmatrix} \cdot E_{B,v'}\right) \cdot \\ \sigma_{u_{v=1,cos}}^2 = \frac{\int_0^{\frac{P}{2}} \left|\cos\left(\frac{4 \cdot \pi \cdot x_{stage}}{P}\right)\right| \cdot dx_{stage}}{\int_0^{\frac{P}{2}} \left(\left|\sin\left(\frac{4 \cdot \pi \cdot x_{stage}}{P}\right)\right| + \left|\cos\left(\frac{4 \cdot \pi \cdot x_{stage}}{P}\right)\right|\right) \cdot dx_{stage}} \end{cases}$$

$$\begin{cases} \sigma_{u_{v,sin}}^2 = G^2 \cdot \sum_{\substack{v'=-1 \\ v' \neq 0}}^{1} \left(\underline{E}_{A,v'}^H \cdot \frac{1}{2} \cdot \begin{bmatrix} 1 & 1 \\ 1 & 1 \end{bmatrix} \cdot \underline{E}_{A,v'} + \underline{E}_{B,v'}^H \cdot \frac{1}{2} \cdot \begin{bmatrix} 1 & 1 \\ 1 & 1 \end{bmatrix} \cdot \underline{E}_{B,v'}\right) \\[1em] \sigma_{u_{v,cos}}^2 = G^2 \cdot \sum_{\substack{v'=-1 \\ v' \neq 0}}^{1} \left(E_{A,v'}^H \cdot \frac{1}{2} \cdot \begin{bmatrix} 1 & 1 \\ 1 & 1 \end{bmatrix} \cdot E_{A,v'} + E_{B,v'}^H \cdot \frac{1}{2} \cdot \begin{bmatrix} 1 & 1 \\ 1 & 1 \end{bmatrix} \cdot E_{B,v'}\right) \end{cases}$$

In conclusion, there can be now stated a final variance of the estimated alignment position, for the particular case in which the alignment signal consists of only the first diffraction order information, and the alignment mark is symmetrical about a zero value of the stage position. The variance of the estimated, relative alignment position equals:

$$\sigma_{x_{align,v=1}}^2 =$$

$$\left(\frac{P}{4 \cdot \pi} \cdot \frac{1}{u_{v=1,cos}^2 + u_{v=1,sin}^2}\right)^2 \cdot \left(u_{v=1,sin}^2 \cdot \sigma_{u_{v=1,cos}}^2 + u_{v=1,cos}^2 \cdot \sigma_{u_{v=1,sin}}^2\right)$$

$$\sigma_{x_{align,v=1}}^2 = \left(\frac{P}{4 \cdot \pi}\right)^2 \cdot \frac{1}{u_{v=1,cos}^2 + u_{v=1,sin}^2} \cdot G^2 \cdot$$

$$\sum_{\substack{v'=-1 \\ v' \neq 0}}^{1} \left(E_{A,v'}^H \cdot \frac{1}{2} \cdot \begin{bmatrix} 1 & 1 \\ 1 & 1 \end{bmatrix} \cdot E_{A,v'} + E_{B,v'}^H \cdot \frac{1}{2} \cdot \begin{bmatrix} 1 & 1 \\ 1 & 1 \end{bmatrix} \cdot E_{B,v'}\right)$$

$$\begin{cases} \sigma_{x_{align,v=1}}^2 = \left(\frac{P}{4 \cdot \pi}\right)^2 \cdot \frac{1}{u_{v=1,cos}^2 + u_{v=1,sin}^2} \cdot \sigma_{u_{v=1,cos,sin}}^2 \\[1em] \sigma_{u_{v=1,cos,sin}}^2 = G^2 \cdot \sum_{\substack{v'=-1 \\ v' \neq 0}}^{1} \left(\underline{E}_{A,v'}^H \cdot \frac{1}{2} \cdot \begin{bmatrix} 1 & 1 \\ 1 & 1 \end{bmatrix} \cdot \underline{E}_{A,v'} + E_{B,v'}^H \cdot \frac{1}{2} \cdot \begin{bmatrix} 1 & 1 \\ 1 & 1 \end{bmatrix} \cdot E_{B,v'}\right) \\[1em] u_0 \approx 2 \cdot \sum_{\substack{v=-N \\ v \neq 0}}^{N} \left(E_{A,v}^H \cdot \frac{1}{2} \cdot \begin{bmatrix} 1 & 1 \\ 1 & 1 \end{bmatrix} \cdot E_{A,v} + E_{B,v}^H \cdot \frac{1}{2} \cdot \begin{bmatrix} 1 & 1 \\ 1 & 1 \end{bmatrix} \cdot E_{B,v}\right) \end{cases}$$

-continued $$\begin{cases} \sigma_{x_{align,v=1}}^2 = \left(\frac{P}{4 \cdot \pi}\right)^2 \cdot \frac{1}{u_{v=1,cos}^2 + u_{v=1,sin}^2} \cdot \sigma_{u_{v=1,cos,sin}}^2 \\[1em] \sigma_{u_{v=1,cos,sin}}^2 \approx G^2 \cdot \frac{u_0}{2} \end{cases}$$

As noted above, this last result holds for the intensity alignment signals from both the sum and difference detectors.

Note that as $$\cos\left(\frac{4 \cdot \pi \cdot v \cdot x_{stage}}{P}\right) \text{ and } \sin\left(\frac{4 \cdot \pi \cdot v' \cdot x_{stage}}{P}\right)$$

will be mutually orthogonal on the scan trajectory interval, it can be concluded that $\text{cov}(u_{v,cos}, u_{v',cos}) = 0$, $\text{cov}(u_{v,sin}, u_{v',sin}) = 0$ and $\text{cov}(u_{v,cos}, u_{v',sin}) = 0$, for $v \in \{1, \ldots, N\}$ and $v' \in \{1, \ldots, N\}$, and $v \neq v'$. Hence the covariance matrix $\underline{C}_{x_{align,meas}}$ of multiple alignment position estimates will be a diagonal matrix. Therefore the diagonal matrix $\underline{C}_{x_{align,meas}}$ can be assembled by placing $\sigma_{x_{align,v}}^2$, on the appropriate corresponding (diagonal) location. The above equations for the variances can be expressed in different forms, according to the nomenclature and conventions of the environment in which they are being used. In one embodiment, for example, they can be rewritten in the form:

$$\sigma_{x_{align,v=1}}^2 = \left(\frac{P}{2 \cdot \pi}\right)^2 \cdot \frac{1}{N_{max}}$$

-continued $$\sigma_{x_{align,v=1}} = \frac{P}{2 \cdot \pi} \cdot \frac{1}{\sqrt{N_{max}}}.$$

To this, one can make use of the identity $$4 \cdot \left| E_{B,v=1}^H \cdot \frac{1}{2} \cdot \begin{bmatrix} 1 & 1 \\ 1 & 1 \end{bmatrix} \cdot E_{A,v=1} \right| \approx$$

$$2 \cdot \left( E_{A,v=1}^H \cdot \frac{1}{2} \cdot \begin{bmatrix} 1 & 1 \\ 1 & 1 \end{bmatrix} \cdot E_{A,v=1} + E_{B,v=1}^H \cdot \frac{1}{2} \cdot \begin{bmatrix} 1 & 1 \\ 1 & 1 \end{bmatrix} \cdot E_{B,v=1} \right),$$

which is valid if $\gamma=22.5°$ and is purely x-polarized or y-polarized., , , . This result can be verified numerically to confirm that the "rule of thumb" calculation agrees with the full numerical solution.

Incidentally, in a case where the asymmetry measuring arrangement 460 and the alignment sensor both work in parallel and share the same illuminator, the same detector integration time (i.e. effective scan length) applies. A lot of the calculations and derivations of results can be common to the different arrangements. It can also be arrange that the asymmetry sensor and the alignment sensor have the same scaling constant. Other noise sources can be taken into account, if they are known. For example, sensor electronics noise and/or mechanical vibration can be taken into account.

As seen above, a plethora of different alignment position measurements are in fact obtained from the position-varying intensity signals captured by detectors 430A, 430B. A different measurement $x_{align}(\lambda_0, \underline{E}_S, v)$ can be obtained for each combination of color ($\lambda_0$), polarization ($\underline{E}_S$) decomposed order ($v$). There are other ways to derive a single position measurement $x_{align}$ from these multiple measurements, besides just selecting a 'best' one of the waveforms and orders. Rather than discarding all but the "best", one can use an average of the measurements as the single result. Various different averages can be used, which can also be referred to as "location estimators". These include means, medians, weighted means, or weighted medians. Outliers can be discarded also. Rank based estimators such as Hodges-Lehmann estimators may be used. The average can be weighted in some way, if the relative quality of the different measurements $x_{align}(\lambda_0, \underline{E}_S, v)$ can be identified. Computed above are the accompanying variance of these measurements $\sigma_{align}^2(\lambda_0, \underline{E}_S, v)$, which can be used for such weighting. Recall that the measurements are (assumed to be) uncorrelated. In the present apparatus, asymmetry corrections are applied to obtain corrected versions of the numerous position measurements, before the "best" single position measurement is calculated. While in principle the concept just described is to use "all" the measurements instead of discarding all but the "best" one, hybrid approaches are possible in which multiple measurements are used in the calculation after discarding some number of measurements that are judged to be the "worst". This may be done for example to reduce processing effort. In addition, one or more statistical techniques may be applied such as trimming (discarding outliers) or Winsorizing' (adjusting outliers to fall within a predetermined percentile), before an average result is calculated.

Referring to steps S45 and S46, the present embodiment obtains additional information from the detector sum and/or difference waveforms to supplement the information used to reconstruct the alignment target asymmetry. In particular, there is disclosed the optional use of (estimated) intensity |$\underline{E}_{L,v}^H \cdot \underline{E}_{U,v}$| of the periodic components of various orders. This is not to be confused with the intensity as seen by either detector 430A, 430B. The following result from the above:

$$\sqrt{u_{v,cos}^2 + u_{v,sin}^2} \approx 4 \cdot \left| E_{B,v}^H \cdot \frac{1}{2} \cdot \begin{bmatrix} 1 & 1 \\ 1 & 1 \end{bmatrix} \cdot \underline{E}_{A,v} \right|$$

allows us to calculate the intensity of each periodic component as measured by the apparatus, which can be compared with the modeled intensity to refine the model. The steps S45, S46 are optional and further discussion of their implementation is deferred until later in this description.

Calculation of Refined Asymmetry Measurement

Figure 19:
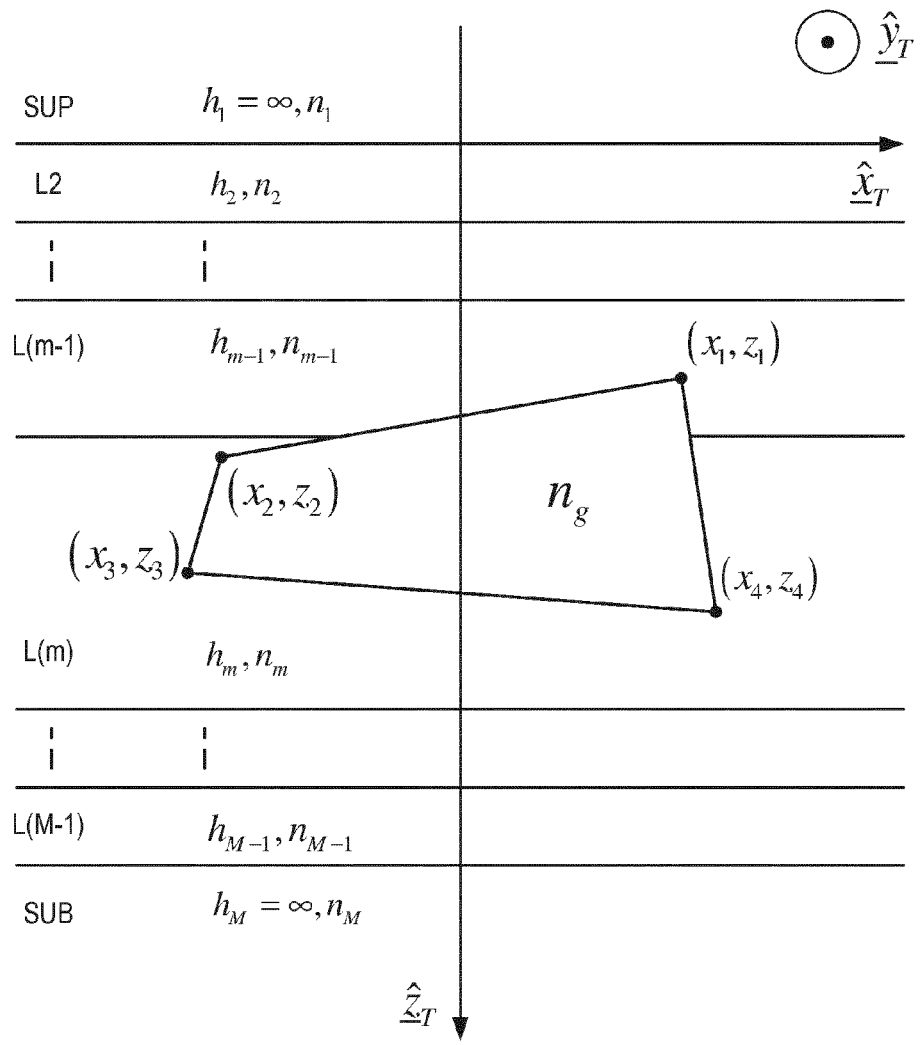
FIG. 19 defines parameters of a model target structure that may be used in an embodiment.

FIG. 19 illustrates a simple target model for an alignment grating with periodicity in the X direction. In this model, a number M of distinct layers L(m) are defined, ranging from a "superstrate" SUP layer (Layer 1) which is effectively the free space above the target, to a substrate SUB (Layer M) which is, for example, in the bulk of substrate W, below the target. Parameter $n_m$ denotes the complex index of refraction of the material in each individual layer, while $h_m$ denote the height of each individual layer. Parameter $n_g$ denotes the complex index of refraction of the material forming the target grating. The geometry of a single grating line is represented by four vertices $(x_v, z_v)$, $v \in \{1,2,3,4\}$. This geometry is understood to be repeated with spatial period P to the left and right of the diagram. It will be appreciated that a more complex grating profile will involve more vertices to represent it $v \in \{1, \ldots V\}$. Note that if there is partial overlap between an (input) layer and the grating, then additional layers can be used to discretize the grating (using a stair casing approach) per vertex to vertex z-interval, and one or two extra layer(s) will be used to model the non-overlapping part of the layer.

All of these parameters of the materials and geometry of the layers and the grating structure forming the alignment target in combination constitute the model that is the basis of calculating the measured alignment position, and one or more properties of the target structure. Parameters of the model can be set to fixed values, while others are allowed to "float" for the purposes of reconstruction. Parameters can be derived from combinations of other parameters. Critical dimension, side wall angle and/or the like are all parameters that can be derived from the vertex positions $(x_v, z_v)$. A particular derived parameter is what it is called asymmetry, and can be defined in a variety of ways, to suit the application. Whatever one or more parameters are used, the one or more floating (unknown) parameters can be summarized by a column vector denoted as $\underline{p}$.

Referring now to step S47 of FIG. 11, how an asymmetry measurement is refined in step S4 is described, using the position signals derived from the detectors 430A, 430B. As mentioned already, this technique is based on using the alignment position information as measured in different component signals, to estimate/reconstruct the alignment target asymmetry by refining the parameterized model. Making use of this additional information can be beneficial for two reasons, even if direct asymmetry measurements have already been made using a dedicated asymmetry sensor (arrangement 460). First, it can make use of extra different information and reduce (unknown, floating) parameter correlations in the target model upon which the alignment position measurement is based. Secondly, making use of all the alignment position signals from detectors 430A, 430B increases the total number of photons used, and hence it will reduce the impact of the photon Poisson noise.

An asymmetry estimation/reconstruction problem can be expressed by defining a residual function of measurements made in step S3 by the asymmetry measuring arrangement 460. The asymmetry measurement arrangement 460 (referred to as the "asymmetry sensor" for short) can be of any type, for example of the type described in U.S. 61/684,006 mentioned above, or of a type forming a pupil image for angle-resolved scatterometry. A detailed understanding of the asymmetry sensor is not necessary for an understanding of the present subject.

The residual function can be defined as follows:

$$\underline{R}(\underline{p}) = \begin{bmatrix} \underline{C}_{\underline{I}_{D,asymm,meas}}^{-\frac{1}{2}} \cdot (\underline{I}_{D,asymm,model}(\underline{p}) - \underline{I}_{D,asymm,meas}) \\ \underline{C}_{\Delta \underline{x}_{align,meas}}^{-\frac{1}{2}} \cdot (\Delta \underline{x}_{align,model}(\underline{p}) - \Delta \underline{x}_{align,meas}) \end{bmatrix},$$

where the column vector $\underline{I}_{D,asymm,meas}$ denotes all measured intensities from detectors in the asymmetry sensor, the column vector $\underline{I}_{D,asymm,model}(\underline{p})$ denotes all modeled intensities of the same detectors, the column vector $\underline{p}$ denotes the unknown (floating) parameters of the alignment target model, the (diagonal) matrix $\underline{C}_{\underline{I}_{D,asymm,meas}}$ denotes the covariance matrix of all measured asymmetry sensor intensities, the column vector $\Delta \underline{x}_{align,meas}$ denotes all pairwise differences of measured alignment positions (from step S2), the column vector $\Delta \underline{x}_{align,model}(\underline{p})$ denotes all pairwise differences of modeled alignment positions, and the matrix $\underline{C}_{\Delta \underline{x}_{align,meas}}$ denotes the covariance matrix of all pairwise differences of measured alignment positions. Note that the matrix $\underline{C}_{\Delta \underline{x}_{align,meas}}$ is not necessarily a diagonal matrix. Note that the residual $\underline{R}(\underline{p})$ as defined above, will itself have a covariance matrix which equals the identity matrix. In an embodiment not having asymmetry measuring arrangement 460, the residual function would contain only the second covariance matrix $\underline{C}_{\Delta \underline{x}_{align,meas}}$, so that the function is based entirely on measurements of alignment position via detectors 430A, 430B. In the present embodiment, the alignment positions and modeled alignment positions that have been calculated from the waveforms for different color/polarization combinations and different orders are used as the input also to the step S4 for refining the asymmetry measurement. More generally speaking, information of the various orders from the multiple waveforms is used, whether it is already expressed in the form of the position measurements produced in step S2, or is in some other form. Also note that while, in this example, pairwise differences are calculated by simple subtraction of modeled positions, the invention is not limited to this specific interpretation of difference. Difference between positions (or position-related information) can be expressed in other forms, without departing from the scope of the invention. For example, differences between measurements can be expressed by ratios.

The column vector pairwise differences of measured alignment positions $\Delta \underline{x}_{align,meas}$ is defined as $$\Delta \underline{x}_{align,meas} = \begin{bmatrix} \Delta x_{align,v=1,meas} \\ M \\ \Delta x_{align,v=N,meas} \end{bmatrix},$$

in which the difference $\Delta x_{align,v,meas}$ of measured alignment positions between any two component signals is defined as $$\Delta x_{align,v,meas} = x_{align,v,meas}(\lambda_{0,j},\underline{E}_{S,j}) - x_{align,v,meas}(\lambda_{0,m},\underline{E}_{S,m}),$$

where $\lambda_{0,j}$ denotes the illumination wavelength, for measurement j, and $$\underline{E}_{S,j} = \begin{bmatrix} E_{S,\hat{x}_P} \\ E_{S,\hat{y}_P} \end{bmatrix}$$

denotes the electric field at source level, for measurement j, in the $\hat{x}_P$ and $\hat{y}_P$ polarization coordinate system. Note that one could also compute all pairwise differences of the alignment position, between different diffraction orders $v_j \neq v_m$. This will increase the total number of differences, but the implementer should be aware that much of this information is correlated, and hence expanding the number of differences above a certain point may be of limited use.

In addition to the measured positions, one then takes account of predictions of measured positions, obtained from the model. The covariance matrix $\underline{C}_{\Delta \underline{x}_{align,meas}}$ can be computed from $\underline{C}_{\underline{x}_{align,meas}}$ as follows:

$$\underline{C}_{\Delta \underline{x}_{align,meas}} = \frac{\partial \Delta \underline{x}_{align,model}}{\partial \underline{x}_{align,model}} \cdot \underline{C}_{\underline{x}_{align,meas}} \cdot \left(\frac{\partial \Delta \underline{x}_{align,model}}{\partial \underline{x}_{align,model}}\right)^T,$$

where $$\frac{\partial \Delta \underline{x}_{align,model}}{\partial \underline{x}_{align,model}}$$

denotes the Jacobian matrix of derivatives with respect to the alignment positions, of the pairwise differences of modeled alignment positions. Typically this matrix will be a sparse matrix with one 1 and one −1 entry per row only. Hence $\underline{C}_{\Delta \underline{x}_{align,meas}}$ is not necessarily a diagonal matrix, as some of the pairwise differences of modeled alignment positions can be correlated. Hence the implementer can trade off the use of all possible pairwise differences of modeled alignment positions, versus the difficulty of computing the Cholesky decomposition $\underline{C}_{\Delta \underline{x}_{align,meas}}^{-1} = (\underline{C}_{\Delta \underline{x}_{align,meas}}^{-1/2})^T \cdot \underline{C}_{\Delta \underline{x}_{align,meas}}^{-1/2}$, which is needed in the proposed implementation of the asymmetry estimation/reconstruction, discussed below. One solution for this is to include all possible combinations of $\Delta x_{align,v,meas} = x_{align,v,meas}(\lambda_{0,n},\underline{E}_{S,n}) - x_{align,v,meas}(\lambda_{0,m},\underline{E}_{S,m})$, while reducing computational complexity by approximating the matrix $\underline{C}_{\Delta \underline{x}_{align,meas}}$ by its diagonal only. Alternatively one could include only the uncorrelated differences $\Delta x_{align,v,meas}$.

To perform the step S47, the asymmetry estimation/reconstruction problem can be posed in the following terms:

$$\begin{cases} \underline{p}_{asymm,estimated} = \arg\min \|\underline{R}(\underline{p})\|_2^2 \\ \underline{R}(\underline{p}) = \begin{bmatrix} \underline{C}_{\underline{I}_{D,asymm,meas}}^{-\frac{1}{2}} \cdot (\underline{I}_{D,asymm,model}(\underline{p}) - \underline{I}_{D,asymm,meas}) \\ \underline{C}_{\Delta \underline{x}_{align,meas}}^{-\frac{1}{2}} \cdot (\Delta \underline{x}_{align,model}(\underline{p}) - \Delta \underline{x}_{align,meas}) \end{bmatrix} \end{cases}.$$

In other words, the task is to use the calculated covariance matrices, as weighting matrices, to minimize the residual function $\underline{R}(\underline{p})$, and hence to obtain the result $\underline{p}_{asymm,estimated}$ which is a best estimate of the set of parameters of the target model (model of the periodic structure forming the alignment mark 202, etc.). When the model is defined to include one or more asymmetry related parameters, the vector $\underline{p}_{asymm,estimated}$ includes our estimate of asymmetry. This non-linear minimization problem can be solved efficiently, using algorithms known to those skilled in the art, for example Newton minimization approaches. The resulting set of parameters $\underline{p}$ includes the refined asymmetry measurement as one of the parameters, in whatever form of expression is desired. Needless to say, any other parameters that are unknown can also be measured by allowing them to float in the model while the minimization of the residual is performed. For example, the target tilts $\rho_{\hat{y}_P}$ and $\rho_{\hat{x}_P}$ may be an example of parameters that can be allowed to float in the model, and hence be measured in this way.

Referring again to steps S45 and S46, if it is desired to make use of the intensity $$4 \cdot \left| E_{B,v}^H \cdot \frac{1}{2} \cdot \begin{bmatrix} 1 & 1 \\ 1 & 1 \end{bmatrix} \cdot E_{A,v} \right|$$

to provide additional information for the alignment target asymmetry estimation, the residual function used in S47 can be modified to be as follows:

$$\underline{R}(\underline{p}) = \begin{bmatrix} \underline{C}^{-\frac{1}{2}}_{I_{D,asymm,meas}} \cdot \left( I_{D,asymm,model}(\underline{p}) - I_{D,asymm,meas} \right) \\ \underline{C}^{-\frac{1}{2}} \Bigg|_{\substack{\Delta x_{align,meas} \\ 4 \cdot \left| E_{B,v}^H \cdot \frac{1}{2} \cdot \begin{bmatrix} 1 & 1 \\ 1 & 1 \end{bmatrix} \cdot E_{A,v} \right|_{meas}}} \cdot \begin{bmatrix} \Delta x_{align,model}(\underline{p}) - \Delta x_{align,meas} \\ 4 \cdot \left| E_{B,v}^H \cdot \frac{1}{2} \cdot \begin{bmatrix} 1 & 1 \\ 1 & 1 \end{bmatrix} \cdot E_{A,v} \right|_{model} - 4 \cdot \left| E_{B,v}^H \cdot \frac{1}{2} \cdot \begin{bmatrix} 1 & 1 \\ 1 & 1 \end{bmatrix} \cdot E_{A,v} \right|_{meas} \end{bmatrix} \end{bmatrix}$$

where $$\underline{C} \Bigg|_{\substack{\Delta x_{align,meas} \\ 4 \cdot \left| E_{B,v}^H \cdot \frac{1}{2} \cdot \begin{bmatrix} 1 & 1 \\ 1 & 1 \end{bmatrix} \cdot E_{A,v} \right|_{meas}}}$$

denotes the covariance matrix of the column vector $$\begin{bmatrix} \Delta x_{align,meas} \\ 4 \cdot \left| E_{B,v}^H \cdot \frac{1}{2} \cdot \begin{bmatrix} 1 & 1 \\ 1 & 1 \end{bmatrix} \cdot E_{A,v} \right|_{meas} \end{bmatrix}.$$

Note that this matrix is not a diagonal matrix as $\Delta x_{align,meas}$ and $$4 \cdot \left| E_{B,v}^H \cdot \frac{1}{2} \cdot \begin{bmatrix} 1 & 1 \\ 1 & 1 \end{bmatrix} \cdot E_{A,v} \right|_{meas}$$

are mutually correlated.

To avoid costly and complex computations to compute the covariance matrix, one can approximate it by its diagonal. If so, only $\sigma^2_{\Delta x_{align,meas}}$ and $$\sigma^2_{4 \left| E_{B,v}^H \cdot \frac{1}{2} \begin{bmatrix} 1 & 1 \\ 1 & 1 \end{bmatrix} E_{A,v} \right|}$$

are computed. The computation of $\sigma^2_{\Delta x_{align,meas}}$ was discussed already above in the context of calculating the position variances (step S44).

In order to compute $$\sigma^2_{4 \left| E_{B,v}^H \cdot \frac{1}{2} \begin{bmatrix} 1 & 1 \\ 1 & 1 \end{bmatrix} E_{A,v} \right|}$$

in step S46 as follows, the following derivatives are computed:

$$\begin{cases} \dfrac{\partial 2 \cdot |E_{\alpha,-v}^H \cdot E_{\alpha,v}|}{\partial u_{v,cos}} = \dfrac{\partial}{\partial u_{v,cos}} \cdot \sqrt{u_{v,cos}^2 + u_{v,sin}^2} \\ \dfrac{\partial 2 \cdot |E_{\alpha,-v}^H \cdot E_{\alpha,v}|}{\partial u_{v,sin}} = \dfrac{\partial}{\partial u_{v,sin}} \cdot \sqrt{u_{v,cos}^2 + u_{v,sin}^2} \end{cases}$$

-continued $$\begin{cases} \dfrac{\partial 2 \cdot |E_{\alpha,-v}^H \cdot E_{\alpha,v}|}{\partial u_{v,cos}} = \dfrac{u_{v,cos}}{\sqrt{u_{v,cos}^2 + u_{v,sin}^2}} \\ \dfrac{\partial 2 \cdot |E_{\alpha,-v}^H \cdot E_{\alpha,v}|}{\partial u_{v,sin}} = \dfrac{u_{v,sin}}{\sqrt{u_{v,cos}^2 + u_{v,sin}^2}}. \end{cases}$$

Following the same reasoning as in step S44 the following result for the variance of the estimated intensity $$4 \cdot \left| E_{B,v}^H \cdot \frac{1}{2} \cdot \begin{bmatrix} 1 & 1 \\ 1 & 1 \end{bmatrix} \cdot E_{A,v} \right|$$

can be derived:

$$\sigma^2_{4 \left| E_{B,v}^H \cdot \frac{1}{2} \begin{bmatrix} 1 & 1 \\ 1 & 1 \end{bmatrix} E_{A,v} \right|} =$$

$$\dfrac{\partial 4 \cdot \left| E_{B,v}^H \cdot \frac{1}{2} \cdot \begin{bmatrix} 1 & 1 \\ 1 & 1 \end{bmatrix} \cdot E_{A,v} \right|}{\partial u_{v,cos}} \cdot \sigma^2_{u_{v,cos}} \cdot \dfrac{\partial 4 \cdot \left| E_{B,v}^H \cdot \frac{1}{2} \cdot \begin{bmatrix} 1 & 1 \\ 1 & 1 \end{bmatrix} \cdot E_{A,v} \right|}{\partial u_{v,cos}} +$$

-continued $$\sigma^2_{4\cdot\left|E_{B,v}^H\cdot\frac{1}{2}\cdot\begin{bmatrix}1&1\\1&1\end{bmatrix}\cdot E_{A,v}\right|} = \left(\frac{\partial 4\cdot\left|E_{B,v}^H\cdot\frac{1}{2}\cdot\begin{bmatrix}1&1\\1&1\end{bmatrix}\cdot E_{A,v}\right|}{\partial u_{v,sin}}\right)\cdot \sigma^2_{u_{v,sin}} \cdot \frac{\partial 4\cdot\left|E_{B,v}^H\cdot\frac{1}{2}\cdot\begin{bmatrix}1&1\\1&1\end{bmatrix}\cdot E_{A,v}\right|}{\partial u_{v,sin}}$$

$$= \left(\frac{u_{v,cos}}{\sqrt{u_{v,cos}^2+u_{v,sin}^2}}\right)^2\cdot \sigma^2_{u_{v,cos}} +$$

$$\left(\frac{u_{v,sin}}{\sqrt{u_{v,cos}^2+u_{v,sin}^2}}\right)^2\cdot \sigma^2_{u_{v,sin}}$$

$$\sigma^2_{4\cdot\left|E_{B,v}^H\cdot\frac{1}{2}\cdot\begin{bmatrix}1&1\\1&1\end{bmatrix}\cdot E_{A,v}\right|} = \frac{1}{u_{v,cos}^2+u_{v,sin}^2}\cdot\left(u_{v,cos}^2\cdot\sigma^2_{u_{v,cos}} + u_{v,sin}^2\cdot\sigma^2_{u_{v,sin}^2}\right).$$

where the variances $\sigma_{u_{v,cos}}^2$ and $\sigma_{u_{v,sin}}^2$ are computed as before. For the case in which the alignment mark is symmetrical about a zero position and the alignment signal consists only of the first diffraction order, the same lines of reasoning as discussed above can be used to simplify the expression for the variance of each (estimated) intensity $$4\cdot\left|E_{B,v}^H\cdot\frac{1}{2}\cdot\begin{bmatrix}1&1\\1&1\end{bmatrix}\cdot E_{A,v}\right|$$

into:

$$\begin{cases}\sigma_{4\cdot\left|E_{B,v}^H\cdot\frac{1}{2}\cdot\begin{bmatrix}1&1\\1&1\end{bmatrix}\cdot E_{A,v}\right|} = \sigma^2_{u_{v=1,cos,sin}}\\ \sigma^2_{u_{v=1,cos,sin}}\approx G^2\cdot\frac{u_0}{2}.\end{cases}$$

Referring then to step S48 in FIG. 11, the minimization process results in a model with parameters $\underline{p}$ which include an improved measurement of asymmetry of the target grating.

Calculation of Corrected Position Measurements

Returning to FIG. 10, the refined asymmetry measurement is then applied in step S5 to the correction of the numerous position measurements obtained in step S2/S43. Then follows in step S6 the selection or combination of these to obtain a single "best" position measurement. These steps will now be described.

Given all measured alignment positions $\underline{x}_{align,meas}$ and all modeled alignment positions $\underline{x}_{align,model}(\underline{p})$ asymmetry corrected alignment positions $\underline{x}_{align,corrected}$ can be computed as follows:

$$\begin{bmatrix}x_1\\x_2\\M\\x_Q\end{bmatrix}_{align,corrected} =$$

$$\begin{bmatrix}x_1\\x_2\\M\\x_Q\end{bmatrix}_{align,meas} - \left(\begin{bmatrix}x_1(\underline{p})\\x_2(\underline{p})\\M\\x_Q(\underline{p})\end{bmatrix}_{align,model} - x_{align,model,reference}(x_v,z_v)\right)$$

$$\underline{x}_{align,corrected} = \underline{x}_{align,meas} - (\underline{x}_{align,model}(\underline{p}) - x_{align,model,reference}(x_v,z_v)).,$$

In this equation, $Q\in\{1, 2, 3, 4, \ldots\}$ denotes the total number of alignment position measurements (i.e. for all combinations of illumination color and polarization and all Fourier components) and $x_{align,model,reference}(x_v,z_v)$ denotes an alignment reference point x-position. This alignment reference point $(x_{align,model,reference},z_{align,model,reference})$ can be defined as a function of the grating vertices $(x_v,z_v)$ in the model (FIG. 19). So the point $(x_{align,model,reference},z_{align,model,reference})$ denotes the alignment reference point, which one can now select such that its position is most relevant for the actual device patterns, which one wants to align in the lithographic process. This is a particularly interesting facility when one appreciates that the grating is only a distorted version of some ideal profile, and therefore any reference position that one might choose (e.g. the center of the mark) is never precisely defined. Note that the term $(\underline{x}_{align,model}(\underline{p})-x_{align,model,reference}(x_v,z_v))$ denotes the modeled (i.e. taking the alignment grating asymmetry into account) alignment position shift, between the modeled alignment positions and the alignment reference point.

Now in step S6, given the set of corrected alignment positions $\underline{x}_{align,corrected}$, one can compute one single, efficient and robust alignment position estimate, using an appropriate statistical technique for selection or averaging of the candidate measurements. For this, the variances calculated in steps S44 and S46 can be used to assign a higher weighting or rank to the measurements with the highest reliability. Various different averages can be used, which can also be referred to as "location estimators". These include means, medians, weighted means, or weighted medians. Outliers can be discarded also. Rank based estimators such as Hodges-Lehmann estimators may be used. Note that this functionality is comparable to the "Color Dynamics" functionality. As a further refinement, a weighted Hodges-Lehmann location estimator will result in an estimation of the alignment position estimate, in which all information is being used (i.e. all photons are being used), but which is robust against outliers.

To end this description, computation of the alignment position measurement variances $\sigma_{align,corrected}^2$ as a measure of the improved quality of the position measurements obtained by the method herein is discussed. Start by recalling the following equation from above:

$$\underline{x}_{align,corrected}=\underline{x}_{align,meas}-(\underline{x}_{align,model}(\underline{p})-x_{align,model,reference}(x_v,z_v))\underline{x}_{align,corrected}=\underline{x}_{align,meas}-\Delta x_{align,correction}.$$

where use of the following shorthand notation has been made:

$$\Delta\underline{x}_{align,correction}=x_{align,model}(\underline{p})-x_{align,model,reference}(x_v,z_v)$$

Now recall from the discussion of step S44 above that all alignment position measurements $x_{align,meas}$ are mutually uncorrelated (at least for the photon Poisson noise component of the uncertainty). It also assumed that $\underline{x}_{align,meas}$ and $(\underline{x}_{align,model}(\underline{p})\underline{x}_{align,model,reference}(x_v,z_v))$ are not correlated. This is a reasonable assumption in the above embodiment where the asymmetry measurement comes predominantly from the asymmetry sensor (arrangement 460) and therefore makes use of different photons than the position measurement. Hence the variance of $\underline{x}_{align,corrected}$ can be computed using $\underline{\sigma}_{align,corrected}^2=\underline{\sigma}_{align,meas}^2+\underline{\sigma}_{align,correction}^2$, where $\underline{\sigma}_{align,correction}^2$ denotes the variance of $\Delta\underline{x}_{align,correction}=\underline{x}_{align,model}(\underline{p})-x_{align,model,reference}(x_v,z_v)$. In other words, the variance of the measured position after correction is greater than before correction. At first sight, it would appear that consequently the corrected measurement is inferior to the uncorrected one. However, it should be remembered that the variance relates only to the reproducibility of the measurement, and the greater aim is to eliminate or at least reduce systematic errors in the position measurements, caused by absent or inaccurate knowledge of asymmetry in the target grating. Therefore, provided that the additional variance is smaller than the systematic gain in accuracy, an overall benefit is achieved.

In order to quantify the additional variance, some calculations and simulations are made for different stacks. These indicate that, for the color(s) that already has the best reproducibility (i.e. lowest standard deviation $\sigma_{x_{align,meas}}$), the additional deviation $\sigma\Delta_{x_{align,correction}}$ is in the ratio $$\frac{\sigma_{\Delta x_{align,correction}}}{\sigma_{x_{align,meas}}} \approx \frac{1}{3}.$$

Therefore the reduction in reproducibility of the final measurement is only modest, and this disadvantage can easily be outweighed by the reduction in systematic error. Note that it is assumed that the optics transmission of the asymmetry branch and the optics transmission of the alignment branch are equal. Note that it is also assumed here that 16 wavelengths are used to estimate the target asymmetry, while only one wavelength (i.e. the one with the best signal quality for the particular target) is used to estimate the alignment target position.

Note that the systematic gain in accuracy and the additional deviation can be calculated and compared, before deciding to use the corrected measurement. In other words, in circumstances where the additional variance is larger than the systematic gain in accuracy, the correction can be discarded. The decision to discard the correction is something that can be determined either beforehand (i.e. when defining the recipe for particular targets), or in real time (i.e. in response to data observed while measuring).

CONCLUSION

The above disclosure described how measurements of a property such as asymmetry can be derived by comparing a number of different results that all are derivable from position dependent signals existing in the alignment sensor. Some of these signals are results related to the position of the mark, and may for example be position measurements produced using different colors, polarizations and/or different spatial frequency components of position-dependent optical signals detected in the alignment sensor. Other results can be considered, for example the intensity values of the signals related to position, to obtain further information on the structure property. The information from these results may be combined with other measurements of the property, for example made by a separate measuring branch operating with the same illumination arrangement as the alignment sensor.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the apparatus, it may be a processing unit or units dedicated to the alignment sensor and/or it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of measuring a geometric property, other than a position, of a structure, the method comprising:
illuminating the structure with radiation and detecting radiation diffracted by the structure using a detector;
processing signals representing the diffracted radiation to obtain a plurality of results related to the position of the structure, each result having the same form but being influenced in a different way by a variation in the property; and
calculating a measurement of the property of the structure that is at least partially based on a difference observed among the plurality of results, wherein the calculating the measurement of the property uses the difference in combination with another result obtained using radiation diffracted by the structure, the other result not related to the position of the structure.

2. The method of claim 1, wherein the plurality of results includes results based on illumination and detection of radiation at different wavelengths.

3. The method of claim 1, wherein the plurality of results includes results based on illumination and detection of radiation at different polarizations.

4. The method of claim 1, wherein the plurality of results includes results based on different spatial frequencies within a position-dependent signal received by the detector.

5. The method of claim 4, wherein the structure has a form that is substantially periodic in one or more directions, and the different spatial frequencies correspond to different orders of diffraction by the periodic structure.

6. The method of claim 1, wherein the other result is obtained using another detector processing a different portion of the radiation diffracted by the structure at the same time as the detecting the radiation diffracted by the structure using the detector.

7. The method of claim 1, wherein the other result includes a result obtained from the same signals as the results related to the position of the structure.

8. The method of claim 1, wherein the property is an asymmetry related parameter of the structure.

9. A method of measuring a position of a periodic structure, the method comprising:
illuminating the structure with radiation and detecting radiation diffracted by the structure using a detector;
processing signals representing the diffracted radiation to obtain a plurality of results related to the position of the structure, each result having the same form but being influenced in a different way by a variation in a geometric property, other than the position, of the structure;
calculating a measurement of the property of the structure that is at least partially based on a difference observed among the plurality of results; and
calculating a measurement of the position of the structure using one or more of the plurality of results corrected in accordance with the measurement of the property.

10. The method of claim 9, wherein calculating the measurement of the position comprises applying corrections to two or more of the plurality of the results using the measurement of the property, followed by calculating the position measurement using one or more of the corrected results.

11. The method of claim 9, wherein calculating the measurement of the position comprises calculating a quality measure for each of the plurality of results and using the quality measures to determine to what degree each result contributes to the position measurement.

12. A method of manufacturing devices wherein a device pattern is applied to a substrate using a lithographic process, the method including positioning the applied pattern by reference to a measured position of a periodic structure formed on the substrate, the measured position obtained by the method of claim 9.

13. The method of claim 9, wherein the plurality of results includes results based on illumination and detection of radiation at different wavelengths.

14. The method of claim 9, wherein the plurality of results includes results based on illumination and detection of radiation at different polarizations.

15. The method of claim 9, wherein the plurality of results includes results based on different spatial frequencies within a position-dependent signal received by the detector.

16. The method of claim 15, wherein the different spatial frequencies correspond to different orders of diffraction by the periodic structure.

17. The method of claim 9, wherein the calculating the measurement of the property uses the difference in combination with another result obtained using radiation diffracted by the structure, but not related to the position of the structure.

18. The method of claim 17, wherein the other result is obtained using another detector processing a different portion of the radiation diffracted by the structure at the same time as the detecting the radiation diffracted by the structure using the detector.

19. The method of claim 17, wherein the other result includes a result obtained from the same signals as the results related to the position of the structure.

20. The method of claim 9, wherein the property is an asymmetry related parameter of the structure.

21. A lithographic apparatus comprising:
a patterning subsystem configured to transfer a pattern to a substrate;
a measuring subsystem configured to measure a position of the substrate in relation to the patterning subsystem,
wherein the patterning subsystem is arranged to use the position measured by the measuring subsystem to apply the pattern at a desired position on the substrate, and
wherein the measuring subsystem is configured to measure the position of the substrate using a periodic structure on the substrate and measure the position of the periodic structure by:
illuminating the periodic structure with radiation and detecting radiation diffracted by the periodic structure using a detector;
processing signals representing the diffracted radiation to obtain a plurality of results related to a position of the periodic structure, each result having the same form but being influenced in a different way by a variation in a geometric property, other than the position, of the structure;
calculating a measurement of the property of the periodic structure that is at least partially based on a difference observed among the plurality of results; and
calculating a measurement of the position of the periodic structure using one or more of the plurality of results corrected in accordance with the measurement of the property.

22. The apparatus of claim 21, wherein the property is an asymmetry related parameter of the structure.

23. An apparatus to measure a position of a structure, the apparatus comprising:

a detecting arrangement configured to detect radiation diffracted by the structure using a detector;

a processing arrangement configured to process signals representing the diffracted radiation to obtain a plurality of results related to a position of the structure, each result having the same form but being influenced in a different way by variation in a geometric property, other than the position, of the structure;

a calculating arrangement configured to calculate a position of the structure using one or more of the results obtained by the processing arrangement, wherein the calculating arrangement is configured to include a correction in the calculated position in accordance with a measurement of the property of the structure, and wherein the calculating arrangement is configured to calculate the measurement of the property of the structure at least partially on the basis of a difference observed among the plurality of results.

24. The apparatus of claim 23, further comprising an illuminating arrangement arranged to illuminate the structure with radiation of a plurality of wavelengths, and wherein the detecting arrangement is configured to detect separately the radiation of the plurality of wavelengths and wherein the plurality of results obtained by the processing arrangement include a plurality of results obtained using radiation of different wavelengths.

25. The apparatus of claim 23, wherein the plurality of results obtained by the processing arrangement include a plurality of results corresponding to different diffraction orders in the diffracted radiation.

26. The apparatus of claim 25, arranged to scan the structure with the radiation and wherein the detecting arrangement includes an interferometer configured to generate a position dependent signal that varies as the structure is scanned with the radiation, and wherein the plurality of results corresponding to different diffraction orders are obtained by extracting different spatial frequency components from the position dependent signal.

27. The apparatus of claim 23, wherein the property is an asymmetry related parameter of the structure.

* * * * *